United States Patent
Kaise et al.

(10) Patent No.: US 11,036,106 B2
(45) Date of Patent: Jun. 15, 2021

(54) ACTIVE MATRIX SUBSTRATE AND DISPLAY DEVICE

(71) Applicant: Sharp Kabushiki Kaisha, Sakai (JP)

(72) Inventors: Yasuyoshi Kaise, Sakai (JP); Keiichi Ina, Sakai (JP); Yuhichiroh Murakami, Sakai (JP); Shige Furuta, Sakai (JP); Hidekazu Yamanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/628,049

(22) PCT Filed: Jun. 28, 2018

(86) PCT No.: PCT/JP2018/024630
§ 371 (c)(1),
(2) Date: Jan. 2, 2020

(87) PCT Pub. No.: WO2019/009185
PCT Pub. Date: Jan. 10, 2019

(65) Prior Publication Data
US 2021/0141277 A1    May 13, 2021

(30) Foreign Application Priority Data
Jul. 5, 2017   (JP) .............................. JP2017-132279

(51) Int. Cl.
*G02F 1/1362*   (2006.01)
*G02F 1/1335*   (2006.01)
(Continued)

(52) U.S. Cl.
CPC ...... *G02F 1/136286* (2013.01); *G02F 1/1368* (2013.01); *G02F 1/133388* (2021.01); *G02F 1/133514* (2013.01)

(58) Field of Classification Search
CPC ............. H01L 27/3276; H01L 27/3244; H01L 27/3262; H01L 27/3211; G02F 1/136286; G02F 1/1368; G02F 1/134309; G02F 1/1362; G02F 1/133514; G02F 1/1333; G02F 1/133388; G02F 1/1343; G02F 1/134336; G02F 1/13629; G02F 2201/123;
(Continued)

(56) References Cited

U.S. PATENT DOCUMENTS

| | | | |
|---|---|---|---|
| 5,610,736 A | 3/1997 | Asai | |
| 2014/0197428 A1 | 7/2014 | Wang et al. | |
| 2017/0154566 A1* | 6/2017 | Ryoo | .......... G02F 1/13 |

FOREIGN PATENT DOCUMENTS

| | | |
|---|---|---|
| JP | 07-230104 A | 8/1995 |
| JP | 2008-257191 A | 10/2008 |

(Continued)

*Primary Examiner* — Thoi V Duong
(74) *Attorney, Agent, or Firm* — Keating & Bennett, LLP

(57) ABSTRACT

A decline in the display quality in portion areas corresponding to source lines that run through an inner non-display area in a display area is reduced. The arrangement of source lines that run through an inner non-display area is changed in an upper change area and a lower change area so that the source lines that are simultaneously driven are not adjacent to each other in a display area and are adjacent to each other in a passage area.

10 Claims, 11 Drawing Sheets

(51) Int. Cl.
*G02F 1/1368* (2006.01)
*G02F 1/1333* (2006.01)

(58) Field of Classification Search
CPC ............. G02F 2201/56; G02F 2201/52; G02F 2001/1635
See application file for complete search history.

(56) References Cited

FOREIGN PATENT DOCUMENTS

| | | |
|---|---|---|
| JP | 2010-054980 A | 3/2010 |
| JP | 2014-134766 A | 7/2014 |

* cited by examiner

ACTIVE MATRIX SUBSTRATE AND DISPLAY DEVICE

TECHNICAL FIELD

The present invention relates to an active matrix substrate and a display device. The present invention particularly relates to an active matrix substrate and a display device in which some or all of source lines comprise bypass portions.

BACKGROUND ART

In recent years, providing an opening in an active-matrix-type display device and using the display device in combination with another device has come into widespread use. For example, display devices are used for the dial faces of analog-type wristwatches, as in PTL 1, and are used for panel faces at which portions of the reels of slot machines are exposed, as in PTL 2.

However, when an opening is provided in an active-matrix-type display device, gate lines and source lines have to extend so as to bypass the opening.

Bypass portions for gate lines and source lines can be provided in a display area, but if the bypass portions are provided in a display area, there is a concern that the display quality declines owing to parasitic capacitances between the bypass portions and pixel electrodes, as disclosed in PTL 3. Such parasitic capacitances between pixel electrodes and other wires or electrodes are important in order to maintain or improve the display quality, and for example, PTL 4 discloses a configuration in which shielding electrodes extend from gate lines so as to overlap source lines, in order to reduce parasitic capacitances between pixel electrodes and the source lines. Thus, the bypass portions generally extend in a non-display area around an opening.

In order to reduce the non-display area around the opening while maintaining or improving the display quality, for example, PTL 1 discloses a configuration in which a plurality of low-voltage power-supply lines and a plurality of high-voltage power-supply lines are integrated together around the opening to save the wiring space of bypass portions for the low-voltage power-supply lines and the high-voltage power-supply line. Also, for example, PTL 3 discloses a configuration in which bypass portions are covered with an organic insulation film to utilize the space between a sealant and an opening as a space for wiring the bypass portions.

CITATION LIST

Patent Literature

PTL 1: Japanese Unexamined Patent Application Publication No. 2008-257191 (published on Oct. 23, 2008)
PTL 2: Japanese Unexamined Patent Application Publication No. 2014-134766 (published on Jul. 24, 2014)
PTL 3: Japanese Unexamined Patent Application Publication No. 2010-54980 (published on Mar. 11, 2010)
PTL 4: Japanese Unexamined Patent Application Publication No. 7-230104 (published on Aug. 29, 1995)

SUMMARY OF INVENTION

Technical Problem

However, in the related art described above, there is a problem in that the display quality declines in portion areas including bypass portions in the display area and corresponding to source lines. This is because adjacent intervals of the bypass portions are small in order to reduce a non-display area around the opening, the parasitic capacitance between bypass portions that are adjacent to each other increases.

One aspect of the present invention has been conceived in view of the foregoing problem, and an object of the present invention is to realize an active matrix substrate and a display device that can reduce a decline in the display quality in portion areas corresponding to source lines that run through an inner non-display area in the display area.

Solution to Problem

In order to overcome the above-described problem, an active matrix substrate according to one aspect of the present invention comprises: a substrate in which an opening area, an inner non-display area outside of the opening area, and a display area outside of the inner non-display area are set; a plurality of gate lines and a plurality of source lines that intersects the gate lines, the gate lines and the source lines extending on the substrate so as to bypass the opening area; and a plurality of pixel transistors that is provided in the display area on the substrate so as to correspond to intersections of the gate lines and the source lines in only the display area. The source lines include a plurality of sets, each including the source lines of a first type to a $P^{th}$ type, where P is a natural number greater than or equal to 2; the source lines of the same type are simultaneously driven; the source lines included in the same set are driven in a time-sharing manner; the source lines that are adjacent to each other in the display area are of types that are different from each other; the inner non-display area includes first sections and a second section; and the source lines that run through the inner non-display area are changed in arrangement in the first sections, and are arranged so that, in the second section, each source line is adjacent to another source line of the same type at at least one side.

In order to overcome the above-described problem, an active matrix substrate according to another aspect of the present invention comprises: a substrate in which an opening area, an inner non-display area outside of the opening area, and a display area outside of the inner non-display area are set; a plurality of gate lines and a plurality of source lines that intersects the gate lines, the gate lines and the source lines extending on the substrate so as to bypass the opening area; and a plurality of pixel transistors that is provided in the display area on the substrate so as to correspond to intersections of the gate lines and the source lines in only the display area. The source lines include the source lines corresponding to a first color, the source lines corresponding to a second color, and the source lines corresponding to a third color, and are arranged so that the corresponding colors repeat in the display area in an order of the first color, the second color, and the third color. The inner non-display area includes first sections and a second section. The source lines that run through the inner non-display area are changed in arrangement in the first sections and are arranged in the second section so that the corresponding colors repeat in an order of the first color, the first color, the second color, the second color, the third color, and the third color.

Advantageous Effects of Invention

One aspect of the present invention offers an advantage that it is possible to reduce a decline in the display quality in portion areas corresponding to source lines that run through an inner non-display area in a display area.

DESCRIPTION OF EMBODIMENTS

First Embodiment

One embodiment of the present invention will be described below in detail with reference to the drawings.

(Wristwatch)

Figure 1:
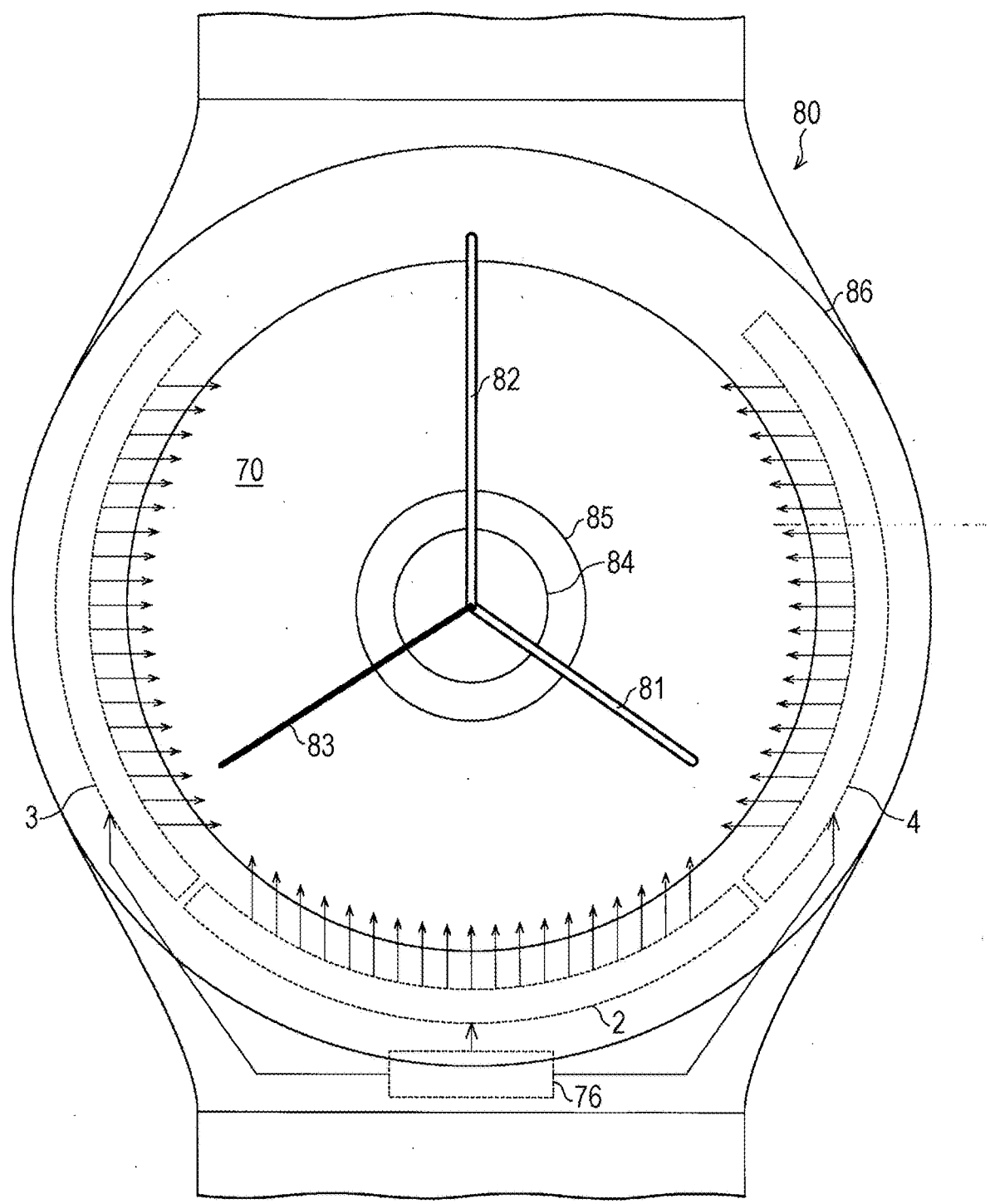
FIG. 1 is a plan view illustrating a schematic configuration of a wristwatch that comprises a liquid-crystal display panel according to some embodiments of the present invention.

FIG. 1 is a plan view illustrating a schematic configuration of a wristwatch 80 that comprises a liquid-crystal display panel 70 (a display device) according to a first embodiment of the present invention.

As illustrated in FIG. 1, the wristwatch 80 is an analog-type watch in which an hour hand 81, a minute hand 82, and a second hand 83 rotate about a drive shaft 84 to thereby indicate time, and the liquid-crystal display panel 70 is used for the dial face of the wristwatch 80. The drive shaft 84 is coupled to a mechanical drive mechanism, built in behind the liquid-crystal display panel 70, through an opening 64 in the liquid-crystal display panel 70. Also, the liquid-crystal display panel 70 is connected to a source driver 2, an odd-numbered-gate driver 3, an even-numbered-gate driver 4, and a control circuit 76, which are built into the wristwatch 80. The inner circumference of the opening 64 in the liquid-crystal display panel 70 is covered by an inner frame 85 in the wristwatch 80, and the outer circumference of the liquid-crystal display panel 70 is covered by a case 86 of the wristwatch 80.

The mechanical drive mechanism for rotating the hour hand 81, the minute hand 82, and the second hand 83 may have any known configuration, and a detailed description thereof is omitted. Also, the liquid-crystal display panel 70 may be used for timepieces (for example, stand clocks and wall clocks) other than the wristwatch 80 and may be used for applications other than timepieces.

(Display Panel)

Figure 2:
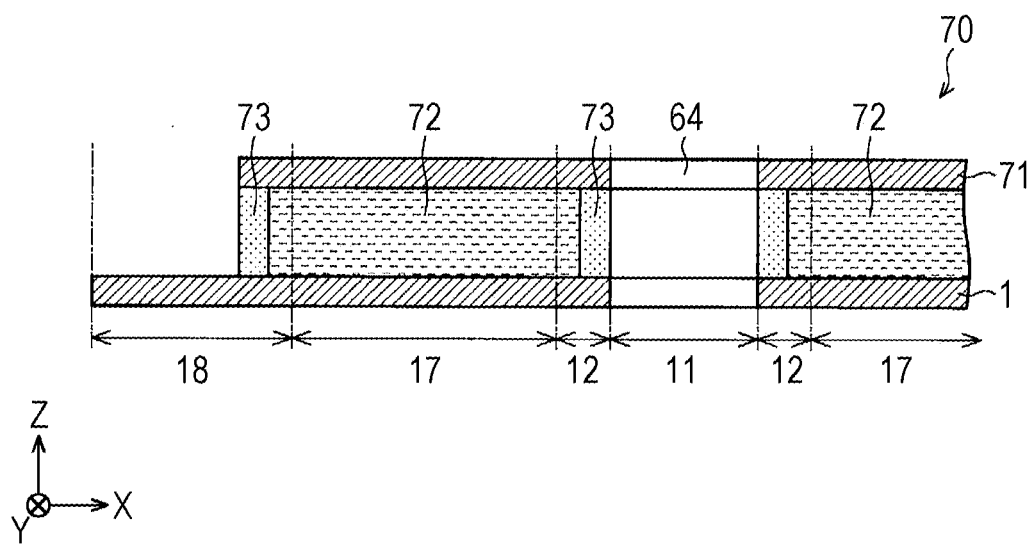
FIG. 2 is a sectional view illustrating a schematic configuration of the liquid-crystal display panel illustrated in FIG. 1.

FIG. 2 is a sectional view illustrating a schematic configuration of the liquid-crystal display panel 70 illustrated in FIG. 1.

As illustrated in FIG. 2, the liquid-crystal display panel 70 comprises an opposing substrate 71, a liquid-crystal layer 72, sealants 73, and an active matrix substrate 1 according to the first embodiment of the present invention. Also, an opening area 11 in which the opening 64 is provided, an inner non-display area 12 outside of the opening area 11, a display area 17 outside of the inner non-display area 12, and an outer non-display area 18 outside of the display area 17 are set in the liquid-crystal display panel 70.

The liquid-crystal display panel 70 in the present embodiment employs a fringe field switching (FFS: Fringe Field Switching) system as a so-called liquid crystal mode. The liquid-crystal display panel 70 is not limited to this system and may employ a liquid crystal mode other than the FFS system. The liquid crystal mode is a mode in which the arrangement of liquid-crystal molecules contained in the liquid-crystal layer 72 is changed. The arrangement of liquid-crystal molecules changes according to an electric field between a common electrode 52 and pixel electrodes 50. Thus, a vertical alignment mode in which a vertical electric field in a direction (a z-axis direction) that is vertical to a substrate surface is applied and a horizontal alignment mode in which a horizontal electric field in a direction (an xy-plane direction) that is horizontal to a substrate surface is applied are known as major liquid crystal modes. Also, in an in-plane switching (IPS: In Plane Switching) system, which is one type of horizontal alignment mode, there is an FFS system in which an oblique electric field including components of both a horizontal electric field and a vertical electric field, the so-called fringe electric field, is applied.

A black matrix and a color filter (neither of which is illustrated) are formed on a surface of the opposing substrate 71, the surface facing the active matrix substrate 1, and a polarizing plate is formed on a reverse surface of the opposing substrate 71. Also, the common electrode 52 may be formed on the opposing substrate 71 in accordance with the liquid crystal mode employed by the liquid-crystal display panel 70.

The liquid-crystal layer 72 is enclosed between the opposing substrate 71 and the active matrix substrate 1 by the sealants 73.

The sealants 73 are formed in the inner non-display area 12 and the outer non-display area 18. Although the sealant 73 formed in the inner non-display area 12 is formed so as to match the inner circumference of the opening 64 in FIG. 2, the sealant 73 may also be formed away from the inner circumference of the opening 64. Although the sealant 73 formed in the outer non-display area 18 is also formed so as to match the outer circumference of the opposing substrate 71 in FIG. 2, the sealant 73 may also be formed away from the outer circumference of the opposing substrate 71.

The shapes of the opposing substrate 71 and the active matrix substrate 1 are generally annular shapes in the first embodiment, but are not limited thereto. For example, the number of openings 64 that are provided may be two or more. For example, the shape of the opening 64 may be another shape, such as a polygonal shape or an egg shape. For example, the shape of the outer circumferences of the opposing substrate 71 and the active matrix substrate 1 may be another shape, such as a polygonal shape or an egg shape, and may differ from the shape of the opening 64.

(Active Matrix Substrate)

Figure 3:
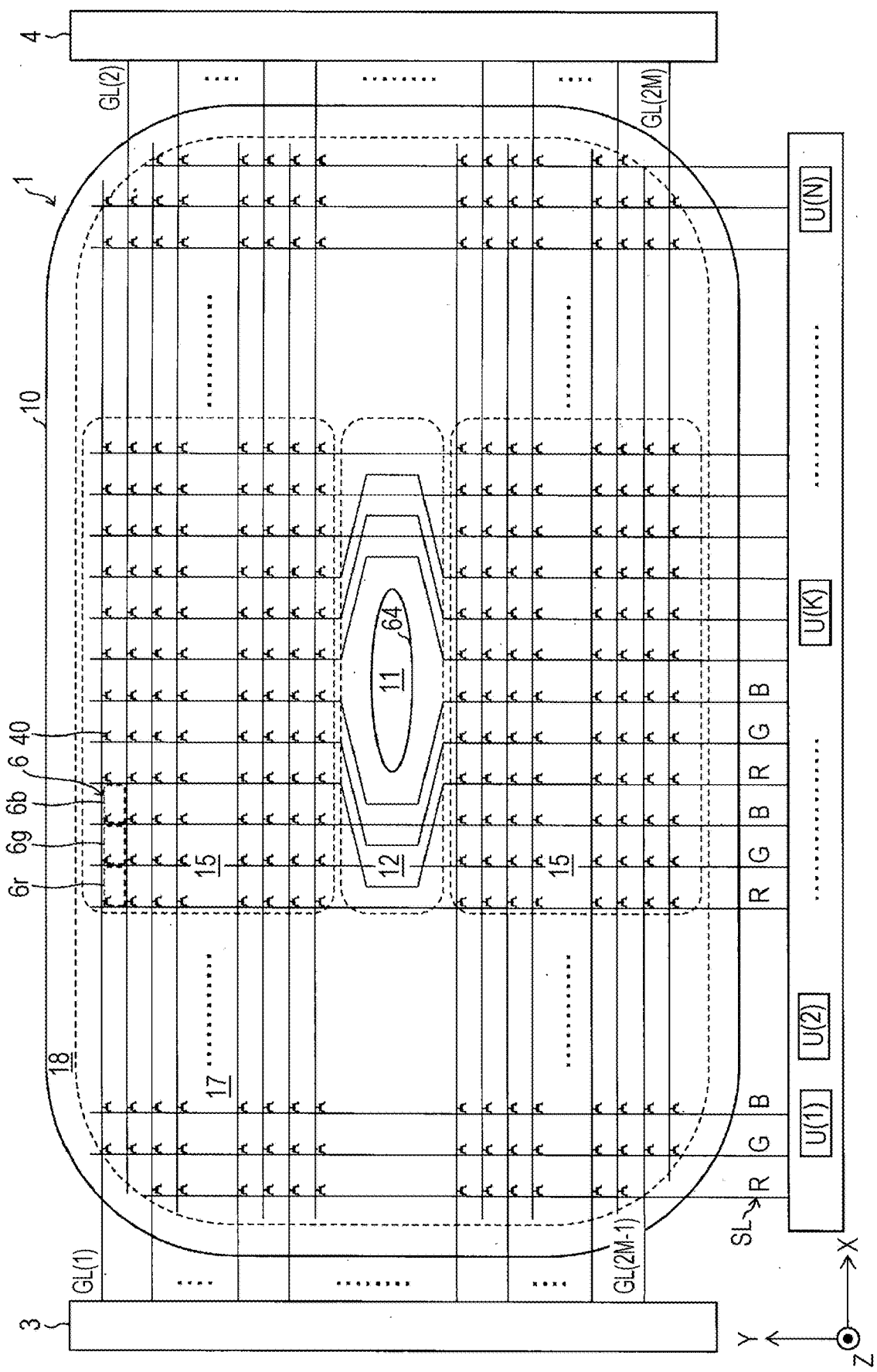
FIG. 3 is a plan view illustrating a schematic configuration of an active matrix substrate according to one embodiment of the present invention.

FIG. 3 is a plan view illustrating a schematic configuration of the active matrix substrate 1 comprised by the liquid-crystal display panel 70 illustrated in FIG. 1. For convenience of illustration, illustration of gate lines GL that run though the inner non-display area 12 and the pixel electrodes 50 is omitted.

Figure 4:
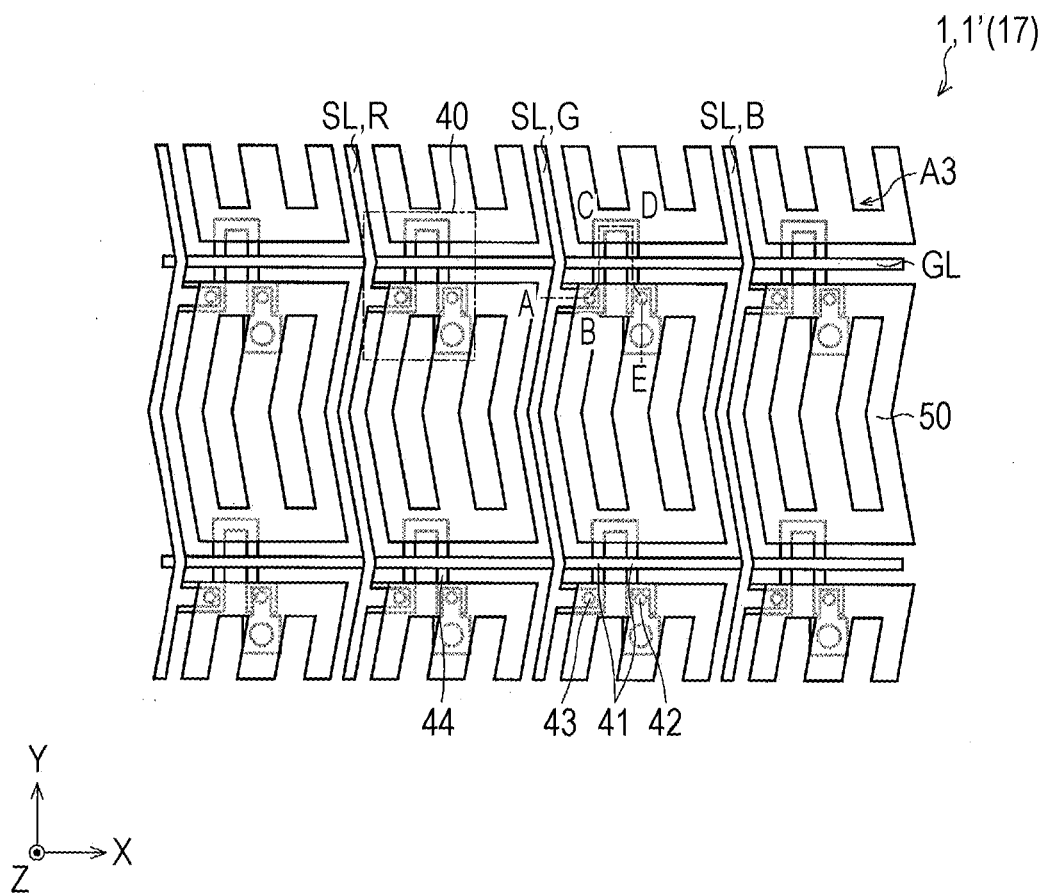
FIG. 4 is a plan view illustrating a schematic configuration of a display area in the active matrix substrate illustrated in FIG. 3.

FIG. 4 is a plan view illustrating a schematic configuration of the display area 17 in the active matrix substrate 1 illustrated in FIG. 3. For convenience of illustration, the common electrode 52 is omitted in FIG. 4.

Figure 5:
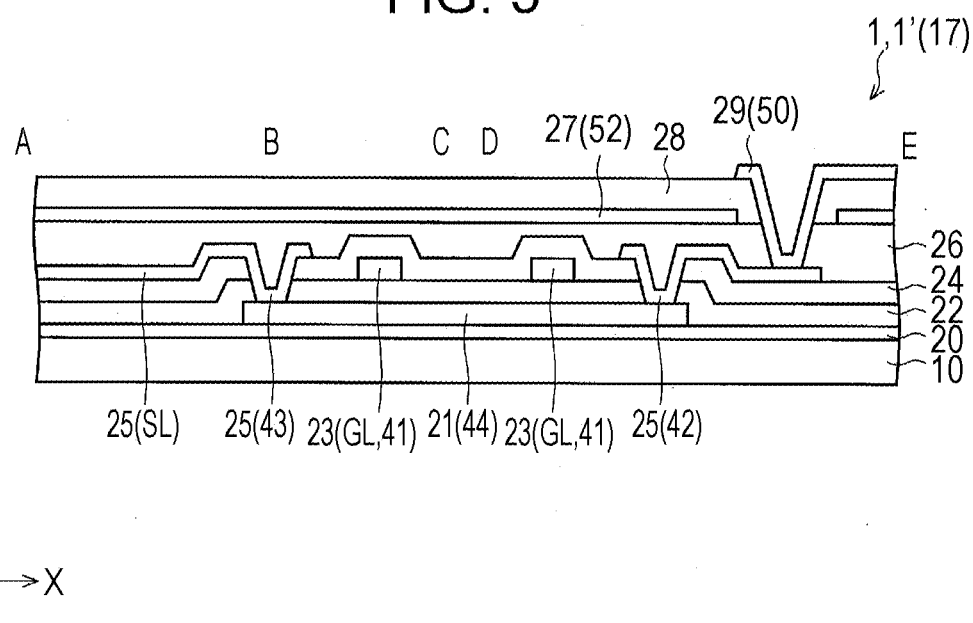
FIG. 5 is a sectional view illustrating a schematic configuration of the display area in the active matrix substrate illustrated in FIG. 3 and is an ABCDE sectional view of FIG. 4.

FIG. 5 is a sectional view illustrating a schematic configuration of the display area 17 in the active matrix substrate 1 illustrated in FIG. 3 and is an ABCDE sectional view of FIG. 4.

As illustrated in FIG. 3, the active matrix substrate 1 comprises an insulating substrate 10, 2M gate lines GL, 12N source lines SL that intersect the gate lines GL, pixel transistors 40 corresponding to the intersections of the gate lines GL and the source lines SL, and pixels 6. Also, the active matrix substrate 1 is connected to the source driver 2, the odd-numbered-gate driver 3, and the even-numbered-gate driver 4. M and N are natural numbers. Also, although illustration is omitted, the active matrix substrate 1 may comprise the common electrode 52, auxiliary capacitance lines that extend parallel to the gate lines GL, a common potential line that supplies a common potential to the common electrode 52, and so on.

An xyz orthogonal coordinate system as described below is used herein.

x-axis: the directions in which the gate lines GL extend in the display area 17.
y-axis: the directions in which the source lines SL extend in the display area 17.
z-axis: the thickness directions of the insulating substrate 10.

(Insulating Substrate and Stacked Structure)

It is preferable that the insulating substrate 10 be a transparent substrate having a high visible light permeability, and for example, a glass substrate or a plastic substrate made of polyethylene terephthalate, polyimide, or the like may be used therefor.

The opening area 11 in which the opening 64 is provided, the inner non-display area 12 that surrounds the opening area 11, the outer non-display area 18 in the vicinity of the outer circumference of the insulating substrate 10, and the display area 17 between the inner non-display area 12 and the outer non-display area 18 are set in the insulating substrate 10.

As illustrated in FIG. 5, in the display area 17, a buffer layer 20, a semiconductor layer 21, a gate insulating film 22, a gate layer 23, a first interlayer insulating film 24, a source layer 25, a second interlayer insulating film 26, a first transparent electrically conductive layer 27, a third interlayer insulating film 28, and a second transparent electrically conductive layer 29 are stacked on the insulating substrate 10 in that order. Also, in the inner non-display area 12, the buffer layer 20, the gate insulating film 22, the gate layer 23, the first interlayer insulating film 24, the source layer 25, the second interlayer insulating film 26, the third interlayer insulating film 28, and the second transparent electrically conductive layer 29 are stacked on the insulating substrate 10 in that order.

The buffer layer 20 is formed so as to cover an entire surface of the insulating substrate 10. The buffer layer 20 is an insulating layer for buffering a difference between the lattice constant of the insulating substrate 10 and the lattice constant of the semiconductor layer 21. The buffer layer 20 is, for example, a silicon oxide film or a silicon nitride film.

The semiconductor layer 21 is formed on the buffer layer 20. The semiconductor layer 21 is a semiconductor layer for forming channels 44 for providing electrical continuity between source electrodes 42 and drain electrodes 43 of the pixel transistors 40. In the present embodiment, the semiconductor layer 21 is constituted by low-temperature polysilicon (LTPS: Low temperature poly silicon). The LTPS layer is formed by, for example, crystallizing an amorphous silicon layer, deposited on the buffer layer 20 by a chemical vapor deposition (CVD: chemical vapor deposition) method, via radiation for Excimer laser annealing.

The semiconductor layer 21 is not limited to the LTPS, may be constituted by another non-oxide semiconductor, such as amorphous silicon, or may be constituted by an oxide semiconductor. The oxide semiconductor that constitutes the semiconductor layer 21 may be an amorphous oxide semiconductor or may be a crystalline oxide semiconductor having crystalline portions. Examples of the crystalline oxide semiconductor include a polycrystalline oxide semiconductor, a fine-crystalline oxide semiconductor, and a crystalline oxide semiconductor having a c-axis aligned generally orthogonal to a layer surface.

The oxide semiconductor that constitutes the semiconductor layer 21 may contain, for example, an In—Ga—Zn—O-based semiconductor. The In—Ga—Zn—O-based semiconductor is a ternary oxide of In (indium), Ga (gallium), and Zn (zinc), has In, Ga, and Zn ratios (composition ratios) that are not particularly limited, and contains, for example, In:Ga:Zn=2:2:1, In:Ga:Zn=1:1:1, In:Ga:Zn=1:1:2, and so on. Alternatively, the oxide semiconductor that constitutes the semiconductor layer 21 may contain, for example, an In—Sn—Zn—O-based semiconductor (for example, $In_2O_3$—$SnO_2$—ZnO:InSnZnO). The In—Sn—Zn—O-based semiconductor is a ternary oxide of In (indium), Sn (tin), and Zn (zinc). Alternatively, the oxide semiconductor that constitutes the semiconductor layer 21 may contain an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, or the like.

The semiconductor layer 21 constituted by the oxide semiconductor may have a stacked structure having two or more layers. For example, Japanese Unexamined Patent Application Publication No. 2014-007399 describes materials, structures, and a deposition method of the amorphous oxide semiconductor and each crystalline oxide semiconductor described above, the configuration of the oxide semiconductor layer having a stacked structure, and so on.

The entire contents disclosed in Japanese Unexamined Patent Application Publication No. 2014-007399 are incorporated herein by reference.

The gate insulating film 22 is formed so as to cover surfaces of the buffer layer 20 and the semiconductor layer 21. The gate insulating film 22 is an insulating film for insulating gate electrodes 41 of the pixel transistors 40 from the channels 44. The gate insulating film 22 may be formed of, for example, an organic insulating material, such as poly para-vinylphenol (PVP), and may be formed of an inorganic insulating material, such as silicon dioxide (SiO2) and silicon nitride (SiNx).

The gate layer 23 is formed on the gate insulating film 22. The gate layer 23 is an electrically conductive layer for forming the gate electrodes 41 of the pixel transistors 40. The gate layer 23 can be formed of, for example, a metallic material, such as titanium (Ti), copper (Cu), chromium (Cr), aluminum (Al), gold (Au), molybdenum (Mo), tungsten (W), an alloy thereof, or the like.

The first interlayer insulating film 24 is formed on the gate insulating film 22 and the gate layer 23. The interlayer insulating films, including the first interlayer insulating film 24, are each an insulating film for providing insulation between different electrically conductive layers or between the electrically conductive layer and the semiconductor layer. The first interlayer insulating film 24 may be formed of an insulating material that is the same as the gate insulating film 22 or may be formed of an insulating material that is different from the gate insulating film 22.

Contact holes for connecting the source electrodes 42 and the drain electrodes 43, formed in the source layer 25, to the channels 44, formed in the semiconductor layer 21, are provided in the gate insulating film 22 and the first interlayer insulating film 24.

The source layer 25 is formed on the first interlayer insulating film 24 and inside the contact holes provided in the gate insulating film 22 and the first interlayer insulating film 24. The source layer 25 is an electrically conductive layer for forming the source electrodes 42 and the drain electrodes 43 of the pixel transistors 40. The source layer 25 can be formed of, for example, a metallic material, such as titanium (Ti), copper (Cu), chromium (Cr), gold (Au), aluminum (Al), molybdenum (Mo), tungsten (W), an alloy thereof, or the like.

The second interlayer insulating film 26 is formed on the first interlayer insulating film 24 and the source layer 25. Similarly to the first interlayer insulating film 24, the second interlayer insulating film 26 may be formed of an insulating material that is the same as the gate insulating film 22 or may be formed of an insulating material that is different from the gate insulating film 22.

The first transparent electrically conductive layer 27 is formed on the second interlayer insulating film 26. The first transparent electrically conductive layer 27 is an electrically conductive layer for forming the common electrode 52. The first transparent electrically conductive layer 27 can be formed of a transparent conductive material, such as an indium tin oxide, so that light from a backlight can be transmitted therethrough.

The third interlayer insulating film 28 is formed on the second interlayer insulating film 26 and the first transparent electrically conductive layer 27. Similarly to the first interlayer insulating film 24, the third interlayer insulating film 28 may be formed of an insulating material that is the same as the gate insulating film 22 or may be formed of an insulating material that is different from the gate insulating film 22.

Contact holes for connecting the pixel electrodes 50, formed in the second transparent electrically conductive layer 29, to the source electrodes 42, formed in the source layer 25, are provided in the second interlayer insulating film 26 and the third interlayer insulating film 28.

The second transparent electrically conductive layer 29 is formed on the third interlayer insulating film 28 and inside the contact holes provided in the second interlayer insulating film 26 and the third interlayer insulating film 28. The second transparent electrically conductive layer 29 is an electrically conductive layer for forming the pixel electrodes 50. The second transparent electrically conductive layer 29 may be formed of a transparent conductive material, such as an indium tin oxide, so that light from a backlight can be transmitted therethrough.

(Pixels)

As illustrated in FIG. 3, the pixels 6 consist of red sub-pixels 6r corresponding to the intersections of red source lines R and the gate lines GL, green sub-pixels 6g corresponding to the intersections of green source lines G and the gate lines GL, and blue sub-pixels 6b corresponding to the intersections of blue source lines B and the gate lines GL. As illustrated in FIG. 4, each of the red sub-pixels 6r comprises the pixel transistor 40 and the pixel electrode 50. Similarly, each of the green sub-pixels 6g comprises the pixel transistor 40 and the pixel electrode 50. Similarly, each of the blue sub-pixels 6b comprises the pixel transistor 40 and the pixel electrode 50.

(Pixel Transistors and Pixel Electrodes)

As illustrated in FIGS. 3 and 4, the pixel transistors 40 and the pixel electrodes 50 are provided on the insulating substrate 10 so as to correspond to the intersections of the gate lines GL and the source lines SL in only the display area 17. The gate electrodes 41 of the pixel transistors 40 are parts of the corresponding gate lines GL. Specifically, portions that are included in the gate lines GL and that superimpose the U-shaped channels 44 in the pixel transistors 40 function as the gate electrodes 41 of the pixel transistors 40. Also, the drain electrodes 43 of the pixel transistors 40 are connected to the corresponding source lines SL, and the source electrodes 42 are connected to the corresponding pixel electrodes 50. Thus, in a line period in which the corresponding gate line GL is selected, a state between the source and the drain of the pixel transistor 40 becomes an electrically conductive state to write a potential in the corresponding source line SL to the pixel electrode 50.

Strictly speaking, the pixel transistors 40 and the pixel electrodes 50 are provided so that both the pixel transistor 40 and the pixel electrode 50 that are paired fit in the display area 17. That is, the pixel electrodes 50 are provided in only the display area 17 so as to correspond to the intersections of the gate lines GL and the source lines SL in only the display area 17.

As illustrated in FIG. 5, the pixel transistors 40 are top-gate type thin-film transistors (thin film transistors: TFTs). The gate electrodes 41 of the pixel transistors 40 is formed by the gate layer 23, the source electrodes 42 and the drain electrodes 43 are formed by the source layer 25, and the channels 44 are formed by the semiconductor layer 21 forms. Such a structure is exemplary, and the pixel transistors 40 may be TFTs having another structure, such as a bottom-gate type, or may be transistors other than TFTs.

As illustrated in FIG. 4, each pixel electrode 50 comprises a plurality of polygonal-line-shaped openings and comprises an outer shape along the openings. Such a shape is exemplary, and the pixel electrode 50 may have any shape according to the liquid crystal mode employed by the liquid-crystal display panel 70.

As illustrated in FIG. 5, the pixel electrodes 50 are formed by the second transparent electrically conductive layer 29 and are connected to the drain electrodes 43 of the pixel transistors 40 through the contact holes.

(Common Electrode)

As illustrated in FIG. 5, the common electrode 52 is formed by the first transparent electrically conductive layer 27. The common electrode 52 is an electrode for changing the arrangement of liquid-crystal molecules, contained in the liquid-crystal layer 72, in cooperation with the pixel electrodes 50. The arrangement of liquid-crystal molecules contained in the liquid-crystal layer 72 changes according to electric fields between the common electrode 52 and the pixel electrodes 50. The common electrode 52 is provided in the opposing substrate 71, provided in the active matrix substrate 1, or provided in both in accordance with an arrangement change mode of liquid-crystal molecules, which is the so-called liquid crystal mode.

The liquid-crystal display panel 70 in the present embodiment employs the FFS system. Therefore, the common electrode 52 is provided above the insulating substrate 10 in the active matrix substrate 1. A specific configuration of the common electrode 52 may be any known configuration in accordance with the liquid crystal mode employed by the liquid-crystal display panel 70.

(Gate Lines)

As illustrated in FIG. 3, the 2M gate lines GL extend generally parallel to each other and at generally regular intervals in the display area 17 in the x-axis direction. Some of the 2M gate lines GL extend through the inner non-display area 12 so as to bypass the opening area 11, and the remaining gate lines GL extend without running through the inner non-display area 12.

In the display area 17 and the inner non-display area 12, the 2M gate lines GL are sequentially arranged from the first gate lines GL(1) to the $2M^{th}$ gate lines GL(2M) in a direction from −y to +y (from one side to the other side in the y-axis direction). Of the 2M gate lines GL, the odd-numbered gate lines GL(1), GL(3), GL(5), . . . , and GL(2M−1) are connected to the odd-numbered-gate driver 3 and are sequentially driven. Of the 2M gate lines GL, the even-numbered gate lines GL(2), GL(4), GL(6), . . . , and GL(2M) are connected to the even-numbered-gate driver 4 and are sequentially driven.

(Source Lines)

The 12N source lines SL intersect the gate lines GL and extend generally parallel to each other and at generally regular intervals in the display area 17. Some of the 12N source lines SL extend through the inner non-display area 12 so as to bypass the opening area 11, and the remaining source lines SL extend without running through the inner non-display area 12.

To be precise, the source lines SL in the present embodiment extend in the display area 17 along the outer shapes of the pixel electrodes 50 in a zigzag manner, as illustrated in FIG. 4. For convenience of illustration, the source lines SL are linearly illustrated in the figures other than FIG. 4.

Portions that are included in the display area 17 and that correspond to the source lines SL that run through the inner non-display area 12, as illustrated in FIG. 3, are referred to as "portion areas 15".

The 12N source lines SL consist of 4N red source lines R connected to the red sub-pixels 6r and corresponding to red (a first color), 4N green source lines G connected to the green sub-pixels 6g and corresponding to green (a second color), and 4N blue source lines B connected to the blue sub-pixels 6b and corresponding to blue (a third color). The red source lines R, the green source lines G, and the blue source lines B are arranged in the display area 17 so as to repeat in the order red, green, and blue in a direction from −x to +x (from one side to the other side in the x-axis direction). Also, the arrangement of the source lines SL that extend through the inner non-display area 12 is changed in the inner non-display area 12.

The 4N red source lines R are sequentially arranged in the display area 17 from the first red source line R(1) to the $4N^{th}$ red source line R(4N) in the direction from −x to +x. Similarly, the 4N green source lines G are sequentially arranged in the display area 17 from the first green source line G(1) to the $4N^{th}$ green source line G(4N) in the direction from −x to +x. Similarly, the 4N blue source lines B are sequentially arranged in the display area 17 from the first blue source line B(1) to the $4N^{th}$ blue source line B(4N) in the direction from −x to +x.

The $(4K−3)^{th}$ to $4K^{th}$ red source lines R(4K−3) to R(4K), the $(4K−3)^{th}$ to $4K^{th}$ green source lines G(4K−3) to G(4K), and the $(4K−3)^{th}$ to $4K^{th}$ blue source lines B(4K−3) to B(4K) are connected to a $K^{th}$ unit circuit U(K) in the source driver 2.

(Control Circuit)

The control circuit 76 supplies synchronization signals to the source driver 2, the odd-numbered-gate driver 3, and the even-numbered-gate driver 4. The control circuit 76 supplies source signals to the source driver 2. The control circuit 76 may have any known configuration. The typical control circuit 76 separates source signals for respective colors of red, green, and blue and sequentially outputs the source signals to the source driver 2.

(Gate Drivers)

The odd-numbered-gate driver 3 and the even-numbered-gate driver 4 may have any known configurations and may have the same configuration or configurations that are different from each other. In the first embodiment, although the odd-numbered-gate driver 3 sequentially drives the odd-numbered gate lines GL, and the even-numbered-gate driver 4 sequentially drives the even-numbered gate lines GL, the driving is not limited thereto. For example, the configuration may be a configuration in which a single gate driver sequentially drives all the gate lines GL.

The odd-numbered-gate driver 3 and the even-numbered-gate driver 4 may be monolithically formed in the active matrix substrate 1.

The odd-numbered-gate driver 3 and the even-numbered-gate driver 4 are generally shift register circuits for selecting the gate lines GL one by one and driving the selected gate lines GL in accordance with the synchronization signals from the control circuit 76. The configurations of shift registers used in the odd-numbered-gate driver 3 and the even-numbered-gate driver 4 may be any known configurations, and detailed descriptions thereof are omitted.

(Source Driver)

The source driver 2 includes N unit circuits U and is connected to the source lines SL and the control circuit 76. Each unit circuit U sequentially selects the source lines SL that are connected thereto and outputs source signals, supplied from the control circuit 76, to the source lines SL. The N unit circuits U are sequentially arranged inside the source driver 2 from the first to the $N^{th}$ unit circuit U in the direction from −x to +x.

The source driver 2 may be monolithically formed in the active matrix substrate 1.

(Unit Circuits)

Figure 6:
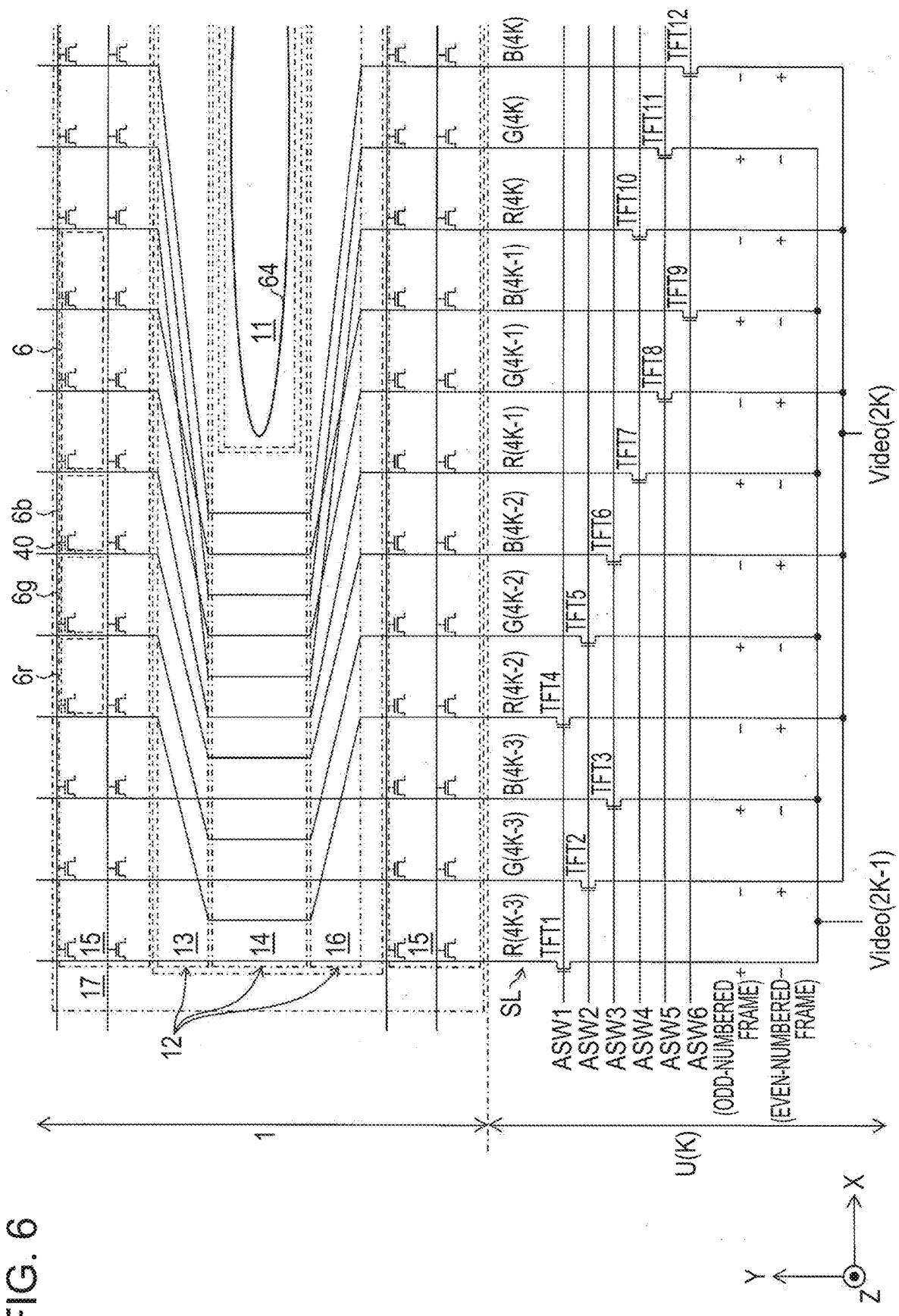
FIG. 6 is a plan view illustrating a schematic configuration of unit circuits in a source driver illustrated in FIG. 3 and source lines that are connected to the unit circuits and that run through an inner non-display area.

FIG. 6 is a plan view illustrating a schematic configuration of the unit circuit U(K) illustrated in FIG. 3 and the source lines SL that are connected to the unit circuit U(K) and also run through the inner non-display area 12. L is a natural number that is greater than or equal to 2 and that is smaller than or equal to K, and K is a natural number that is greater than or equal to 1 and that is smaller than or equal to N. For convenience of illustration, illustration of the pixel electrodes 50, the gate lines GL that run through the inner non-display area 12, and so on is omitted.

As illustrated in FIG. 6, source signals can be supplied from the control circuit 76 to the unit circuit U(K) through the $(2K-1)^{th}$ and $(2K)^{th}$ source signal supply lines Video (2K-1) and Video(2K). The polarities of the source signals supplied through the $(2K-1)^{th}$ source signal supply line Video(2K-1) are positive (+) in an odd-numbered frame and are negative (−) in an even-numbered frame. The polarities of the source signals supplied through the $(2K)^{th}$ source signal supply line Video (2K) are negative (−) in an odd-numbered frame and positive (+) in an even-numbered frame.

The $(4K-3)^{th}$ red source line R(4K-3) is connected to the $(2K-1)^{th}$ source signal supply line Video(2K-1) via a first transistor TFT1.

The $(4K-3)^{th}$ green source line G(4K-3) is connected to the $2K^{th}$ source signal supply line Video(2K) via a second transistor TFT2.

The $(4K-3)^{th}$ blue source line B(4K-3) is connected to the $(2K-1)^{th}$ source signal supply line Video(2K-1) via a third transistor TFT3.

The $(4K-2)^{th}$ red source line R(4K-2) is connected to the $2K^{th}$ source signal supply line Video(2K) via a fourth transistor TFT4.

The $(4K-2)^{th}$ green source line G(4K-2) is connected to the $(2K-1)^{th}$ source signal supply line Video(2K-1) via a fifth transistor TFT5.

The $(4K-2)^{th}$ blue source line B(4K-2) is connected to the $2K^{th}$ source signal supply line Video(2K) via a sixth transistor TFT6.

The $(4K-1)^{th}$ red source line R(4K-1) is connected to the $(2K-1)^{th}$ source signal supply line Video(2K-1) via a seventh transistor TFT7.

The $(4K-1)^{th}$ green source line G(4K-1) is connected to the $2K^{th}$ source signal supply line Video(2K) via an eighth transistor TFT8.

The $(4K-1)^{th}$ blue source line B(4K-1) is connected to the $(2K-1)^{th}$ source signal supply line Video(2K-1) via a ninth transistor TFT9.

The $(4K)^{th}$ red source line R(4K) is connected to the $2K^{th}$ source signal supply line Video(2K) via a tenth transistor TFT10.

The $(4K)^{th}$ green source line G(4K) is connected to the $(2K-1)^{th}$ source signal supply line Video(2K-1) via an 11th transistor TFT11.

The $(4K)^{th}$ blue source line B(4K) is connected to the $2K^{th}$ source signal supply line Video(2K) via a 12th transistor TFT12.

Gate terminals of the first transistor TFT1 and the fourth transistor TFT4 are connected to a first selection line ASW1.

Gate terminals of the second transistor TFT2 and the fifth transistor TFT5 are connected to a second selection line ASW2.

Gate terminals of the third transistor TFT3 and the sixth transistor TFT6 are connected to a third selection line ASW3.

Gate terminals of the seventh transistor TFT7 and the tenth transistor TFT10 are connected to a fourth selection line ASW4.

Gate terminals of the eighth transistor TFT8 and the 11th transistor 11 are connected to a fifth selection line ASW5.

Gate terminals of the ninth transistor TFT9 and the 12th transistor 12 are connected to a sixth selection line ASW6.

Thus, the $K^{th}$ unit circuit U(K) simultaneously drives the $(4K-3)^{th}$ and $(4K-2)^{th}$ red source lines R(4K-3) and R(4K-2), simultaneously drives the $(4K-3)^{th}$ and $(4K-2)^{th}$ blue source lines B(4K-3) and B(4K-2), and simultaneously drives the $(4K-3)^{th}$ and $(4K-2)^{th}$ green source lines G(4K-3) and G(4K-2). Also, the $K^{th}$ unit circuit U(K) simultaneously drives the $(4K-1)^{th}$ and $4K^{th}$ red source lines R(4K-1) and R(4K), simultaneously drives the $(4K-1)^{th}$ and $4K^{th}$ blue source lines B(4K-1) and B(4K), and simultaneously drives the $(4K-1)^{th}$ and $4K^{th}$ green source lines G(4K-1) and G(4K).

Also, the $K^{th}$ unit circuit U(K) drives the $(4K-3)^{th}$ and $(4K-1)^{th}$ red, green, and blue source lines R(4K-3), G(4K-3), B(4K-3), R(4K-1), G(4K-1), and B(4K-1) in a time-sharing manner. Also, the $K^{th}$ unit circuit U(K) drives the $(4K-2)^{th}$ and $4K^{th}$ red, green, and blue source lines R(4K-2), G(4K-2), B(4K-2), R(4K), G(4K), and B(4K) in a time-sharing manner.

Also, the source driver 2 including the N unit circuits U drives the source lines SL in a polarity reversal manner by a frame reversal driving system for reversing the polarity of source signals every frame. Also, the source driver 2 drives the source lines SL in a polarity reversal manner by a one-column reversal driving system for reversing the polarity of source signals every source line SL.

The configurations of the source driver 2 and the unit circuits U are not limited to the above-described configurations. The source driver 2 may be any source driver, as long as it drives the source lines SL in a time-sharing manner and also simultaneously drives a plurality of source lines SL. For example, the source driver 2 may drive the source lines SL in a polarity reversal manner by a line reversal driving system or a dot reversal driving system.

Also, when it is assumed that the source lines SL that are simultaneously driven are of the same type, and the source lines SL connected to the same unit circuit U are included in the same pair, the 12N source lines include N pairs, each including a first set including (i) the $(4K-3)^{th}$ red source line R(4K-3), green source line G(4K-3), and blue source line B(4K-3) (source lines of a first type, a second type, and a third type) and the $(4K-1)^{th}$ red source line R(4K-1), green source line G(4K-1), and blue source line B(4K-1) (source lines of a fourth type, a fifth type, and a sixth type), and a second set including (ii) the $(4K-2)^{th}$ red source line R(4K-2), green source line G(4K-2), and blue source line B(4K-2) (source lines of the first type, the second type, and the third type) and the $4K^{th}$ red source line R(4K), green source line G(4K), and blue source line B(4K) (source lines of the fourth type, the fifth type, and the sixth type).

(Arrangement of Source Lines)

As illustrated in FIG. 6, the source lines SL are arranged in the display area 17 so as to repeat in the order red, green, and blue, whereas the source lines SL are arranged in a passage area 14 in the inner non-display area 12 so as to repeat in the order red, red, green, green, blue, and blue.

In the inner non-display area 12, a portion that is located at an upper side (one side in the extending direction of the source lines SL) of the opening area 11 and in which the arrangement of the source lines SL is changed from the repetition of the order of red, green, and blue to the repetition of the order of red, red, green, green, blue, and blue is referred to as an upper change area 13 (a first section). Also, in the inner non-display area 12, a portion that is located at a lower side (the other side in the extending direction of the source lines SL) of the opening area 11 and in which the arrangement of the source lines SL is changed from the repetition of the order of red, green, and blue to the repetition of the order of red, red, green, green, blue, and blue is referred to as a lower change area 16 (a first section). Also, in the inner non-display area 12, a portion that is sandwiched between the upper change area 13 and the lower change area 16 is referred to as the passage area 14 (a second section).

In the display area 17, the source lines SL are arranged in the direction from −x to +x in the following order from top to bottom:

The $(4K-3)^{th}$ red source line R(4K−3)
The $(4K-3)^{th}$ green source line G(4K−3)
The $(4K-3)^{th}$ blue source line B(4K−3)
The $(4K-2)^{th}$ red source line R(4K−2)
The $(4K-2)^{th}$ green source line G(4K−2)
The $(4K-2)^{th}$ blue source line B(4K−2)
The $(4K-1)^{th}$ red source line R(4K−1)
The $(4K-1)^{th}$ green source line G(4K−1)
The $(4K-1)^{th}$ blue source line B(4K−1)
The $(4K)^{th}$ red source line R(4K)
The $(4K)^{th}$ green source line G(4K)
The $(4K)^{th}$ blue source line B(4K)

Accordingly, the colors corresponding to the source lines SL that are adjacent to each other in the display area 17 differ from each other.

In the passage area 14, the source lines SL are arranged in the direction from −x to +x in the following order from top to bottom:

The $(4K-3)^{th}$ red source line R(4K−3)
The $(4K-2)^{th}$ red source line R(4K−2)
The $(4K-3)^{th}$ green source line G(4K−3)
The $(4K-2)^{th}$ green source line G(4K−2)
The $(4K-3)^{th}$ blue source line B(4K−3)
The $(4K-2)^{th}$ blue source line B(4K−2)
The $(4K-1)^{th}$ red source line R(4K−1)
The $4K^{th}$ red source line R(4K)
The $(4K-1)^{th}$ green source line G(4K−1)
The $4K^{th}$ green source line G(4K)
The $(4K-1)^{th}$ blue source line B(4K−1)
$4K^{th}$ blue source line B(4K)

Accordingly, in the passage area 14, each source line SL is adjacent, at one side, to another source line SL that corresponds to the same color and that is simultaneously driven.

(Change in Arrangement of Source Lines)

In each of the upper change area 13 and the lower change area 16, some of the source lines SL that run through the inner non-display area 12 intersect each other as described below to thereby change the arrangement of the source lines SL.

The $(4K-3)^{th}$ green source line G(4K−3) and the $(4K-2)^{th}$ red source line R(4K−2)
The $(4K-3)^{th}$ blue source line B(4K−3) and the $(4K-2)^{th}$ red source line R(4K−2)
The $(4K-3)^{th}$ blue source line B(4K−3) and the $(4K-2)^{th}$ green source line G(4K−2)
The $(4K-1)^{th}$ green source line G(4K−1) and the $4K^{th}$ red source line R(4K)
The $(4K-1)^{th}$ blue source line B(4K−1) and the $4K^{th}$ red source line R(4K)
The $(4K-1)^{th}$ blue source line B(4K−1) and the $4K^{th}$ green source line G(4K)

Accordingly, in each of the upper change area 13 and the lower change area 16, the $(4K-3)^{th}$ red source line R(4K−3), the $(4K-2)^{th}$ blue source line B(4K−2), the $(4K-1)^{th}$ red source line R(4K−1), and the $4K^{th}$ blue source line B(4K) do not intersect the other source lines SL.

Figure 7:
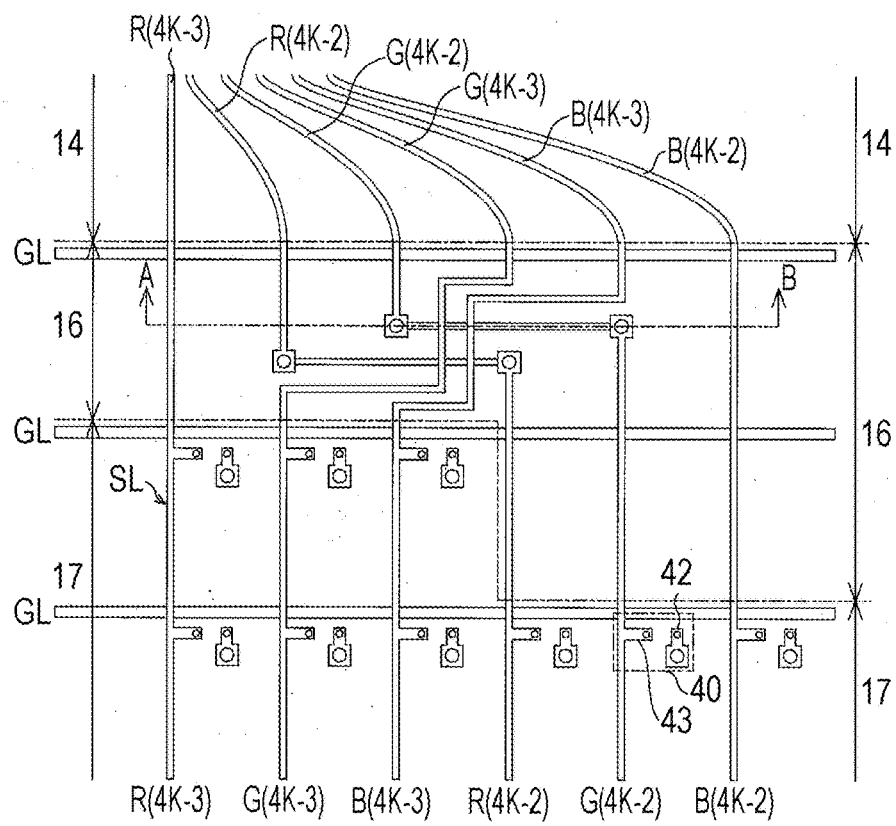
FIG. 7 has (a) a plan view and (b) a sectional view schematically illustrating three-dimensional intersections of the source lines in a lower change area illustrated in FIG. 6.
Figure 7:
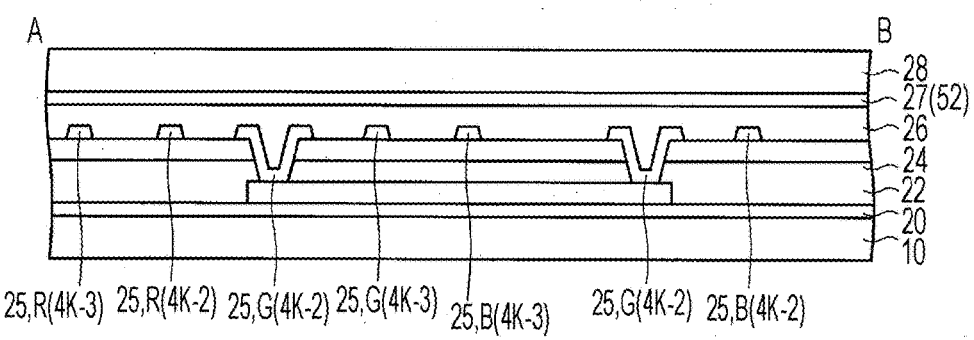
Figure 7:
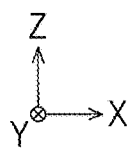

Such intersection of the source lines SL can be realized by, for example, three-dimensional intersections as in FIG. 7.

FIG. 7 has (a) a plan view and (b) a sectional view schematically illustrating three-dimensional intersections of the source lines SL in the lower change area 16 illustrated in FIG. 6. (b) in FIG. 7 is an AB sectional view of (a) in FIG. 7.

As illustrated in FIG. 7, each of the $(4K-2)^{th}$ red source line R(4K−2) and green source line G(4K−2) is constituted by three portions, that is, a portion formed in the source layer 25, a portion formed in the gate layer 23, and another portion formed in the source layer 25, in the lower change area 16. Further, in each of the $(4K-2)^{th}$ red source line R(4K−2) and green source line G(4K−2), the two portions formed in the source layer 25 are relayed by the portion formed in the gate layer 23. Also, each of the $(4K-2)^{th}$ red source line R(4K−2) and green source line G(4K−2) three-dimensionally intersects the $(4K-3)^{th}$ green source line G(4K−3) and blue source line B(4K−3) at the portion formed in the gate layer 23.

Such relay allows two source lines SL that intersect each other while providing electric isolation therebetween. Also, it is preferable that they three-dimensionally intersect each other so that the number of reconnections for the relay is small, as in FIG. 7. This is because the reconnections between the source layer 25 and the gate layer 23 induce a connection failure and also increase wiring resistances in the source lines SL. Also, an electrically conductive layer other than the gate layer 23 may be used for the relay.

The red source lines R(4K−1) and R(4K), the green source lines G(4K−1) and G(4K), and the blue source lines B(4K−1) and B(4K), which are not illustrated in FIG. 7, can also intersect three-dimensionally, similarly to the red source lines R(4K−3) and R(4K−2), the green source lines G(4K−3) and G(4K−2), and the blue source lines B(4K−3) and B(4K−2) illustrated in FIG. 7. Also, in the upper change area 13, the source lines SL can intersect three-dimensionally, as in the lower change area 16.

The arrangement and an arrangement change of the source lines SL are not limited to those described above, and any arrangement or any arrangement change may be made as long as two conditions described below are satisfied.

The source lines SL are arranged in the display area 17 so that the source lines SL that are adjacent to each other in the display area 17 are driven at different times.

The source lines SL are arranged in the passage area 14 so that, in the passage area 14, each source line SL that runs through the inner non-display area 12 is adjacent, at least one side, to another source line SL that is simultaneously driven.

Comparative Example

Figure 12:
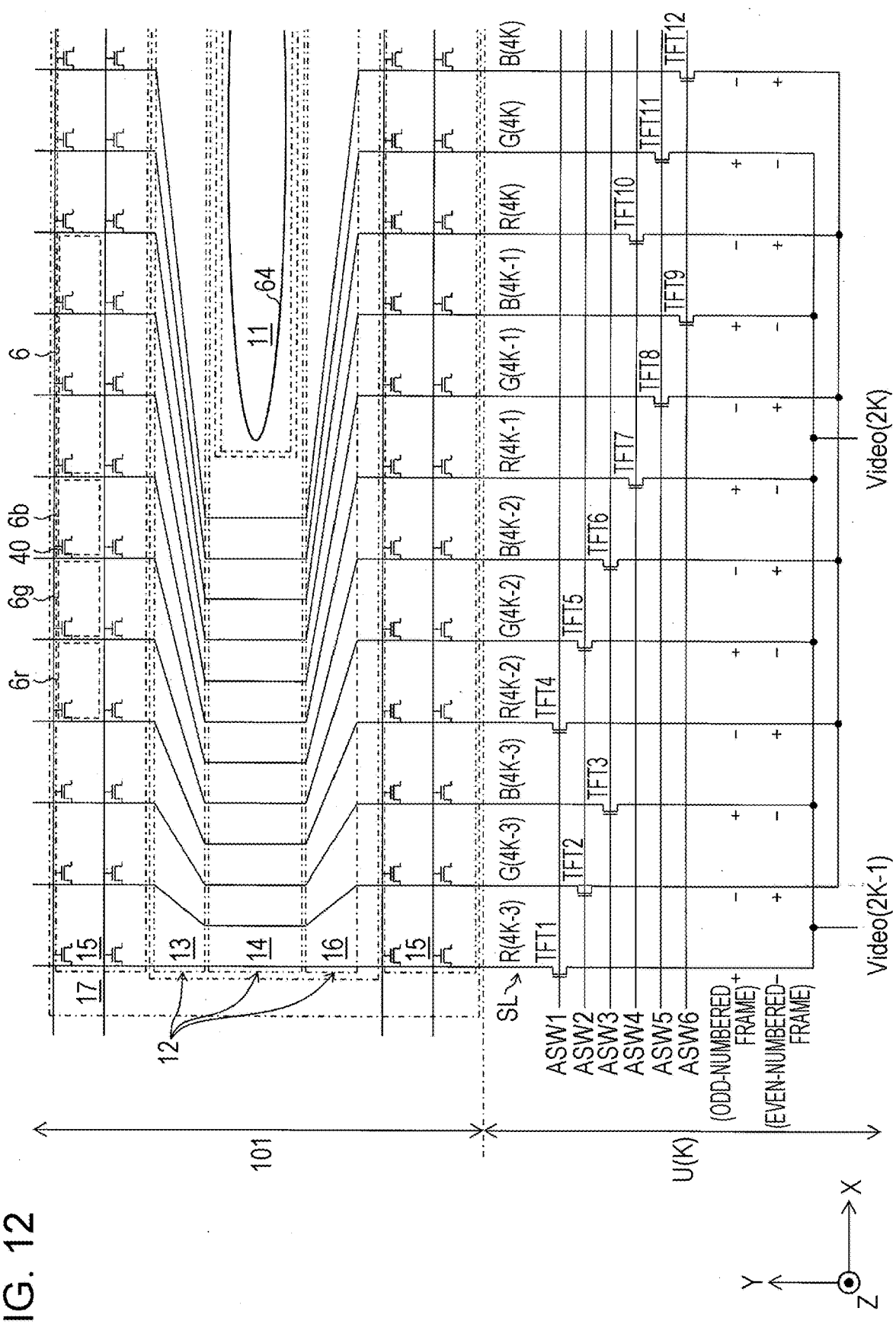
FIG. 12 is a plan view illustrating a schematic configuration of an active matrix substrate, which is a comparative example.

FIG. 12 is a plan view illustrating a schematic configuration of an active matrix substrate 101, which is a comparative example.

As illustrated in FIG. 12, in the active matrix substrate 101, which is a comparative example, the arrangement of the source lines SL is not changed. Thus, the arrangement of the source lines SL in the passage area 14 is the same as the arrangement of the source lines SL in the display area 17.

(Order of Driving Source Lines)

The driving order of driving the source lines SL in a time-sharing manner complies with selection signals supplied to the first to sixth selection signal lines ASW1 to ASW6.

Figure 8:
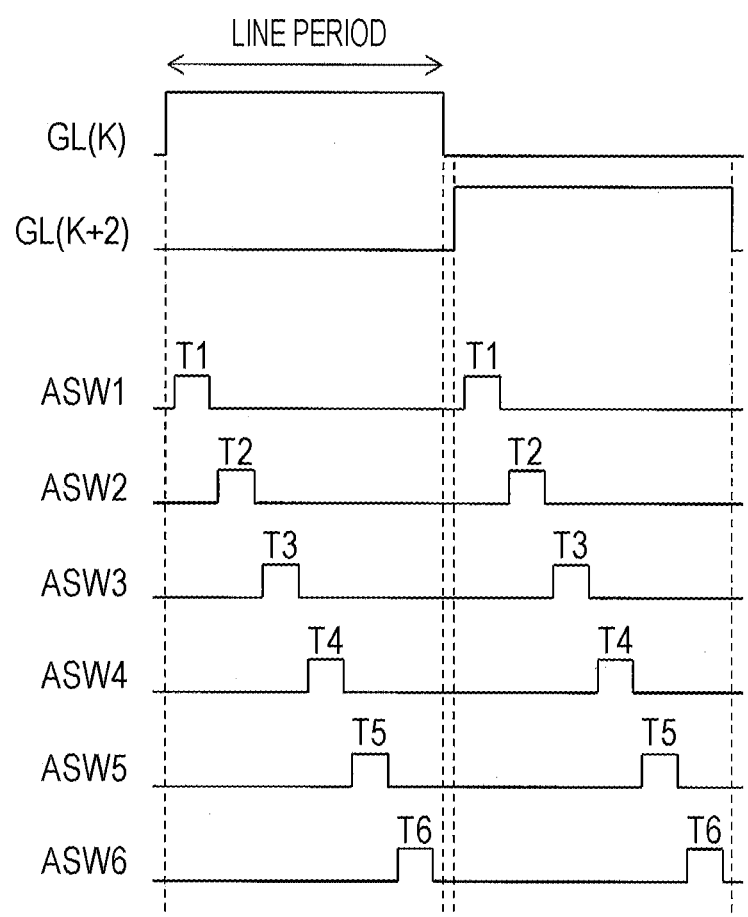
FIG. 8 is a signal diagram illustrating selection signals that are supplied to first to sixth selection signal lines, illustrated in FIG. 6, in a certain order, in contrast with gate signals supplied to gate lines.

FIG. 8 is a signal diagram illustrating selection signals that are supplied to the first to sixth selection signal lines ASW1 to ASW6, illustrated in FIG. 6, in a certain order, in contrast with gate signals supplied to the gate lines GL.

Each gate signal in the gate line GL is illustrated in FIG. 8 as being in a high (High) state in a line period in which the gate line GL is selectively driven and is illustrated in FIG. 8 as being in a low (Low) state in a line period in which the corresponding gate line GL is not driven. Also, each selection signal supplied to the first selection line ASW1 is illustrated in FIG. 8 as being in a high (High) state in a period in which the states between the drains and the sources of the corresponding first transistor TFT1 and the fourth transistor TFT4 are put into an electrically conductive state, and is illustrated in FIG. 8 as being in a low (Low) state in a period in which the states between the drains and the sources are put into an electrically non-conductive state. Similarly, the selection signals supplied to the second to sixth selection signal lines ASW2 to ASW6 are also illustrated in FIG. 8 as being in a high (High) state in a period in which the states between the drains and the sources of the corresponding second, third, and fifth to 12th transistors TFT2, TFT3, and TFT5 to TFT12 are put into an electrically conductive state, and are illustrated in FIG. 8 as being in a low (Low) state in a period in which the states between the drains and the sources are put into an electrically non-conductive state.

With respect to the first to sixth selection signal lines ASW1 to ASW6 illustrated FIG. 6, the selection signals are supplied to the first to sixth selection signal lines ASW1 to ASW6, as in FIG. 8, regardless of the parity of a frame to which the line period belongs and regardless of the parities of the gate lines GL that are driven in the line period. Thus, the source lines SL are sequentially driven from T1 to T6 in each line period, as described below.

T1: First, the $(4K-3)^{th}$ red source line R(4K−3) and the $(4K-2)^{th}$ red source line R(4K−2) are simultaneously driven.

T2: Subsequently, the $(4K-3)^{th}$ green source line G(4K−3) and the $(4K-2)^{th}$ green source line G(4K−2) are simultaneously driven.

T3: Subsequently, the $(4K-3)^{th}$ blue source line B(4K−3) and the $(4K-2)^{th}$ blue source line B(4K−2) are simultaneously driven.

T4: Subsequently, the $(4K-1)^{th}$ red source line R(4K−1) and the $4K^{th}$ red source line R(4K) are simultaneously driven.

T5: Subsequently, the $(4K-1)^{th}$ green source line G(4K−1) and the $4K^{th}$ green source line G(4K) are simultaneously driven.

T6: Lastly, the $(4K-1)^{th}$ blue source line B(4K−1) and the $4K^{th}$ blue source line B(4K) are simultaneously driven.

(The Number of Variations)

The potential in each source line SL is influenced by the potential in another source line SL that is adjacent thereto via a parasitic capacitance therebetween. Thus, the potential in each source line SL varies after driving, when another source line SL that is adjacent to the source line SL is driven after the source line SL in each line period.

Herein, the "number of variations" means the number of times the potential in a certain source line SL in a certain line period varies owing to driving of another source line SL that is adjacent to the certain source line SL after driving of the certain source line SL, unless the "number of variations" is described as having another means. Also, the "number of variations in a certain area" means the number of times the potential in a certain source line SL in a certain line period varies owing to driving of another source line SL that is adjacent to the certain source line SL in a certain area after driving of the certain source line SL, unless the "number of variations in a certain area" is described as having another means. Examples of the "certain area" include the display area 17 and the passage area 14.

Herein, the "amount of variation" means the number of times the potential in a certain source line SL in a certain line period varies owing to driving of another source line SL that is adjacent to the certain source line SL after driving of the certain source line SL, unless the "amount of variation" is described as having another means.

Table 1 is a table illustrating the number of variations in the display area 17 and the passage area 14 according to the above-described arrangement and driving order of the source lines SL.

TABLE 1

| | SL ASW between Video ⇔ SL | | R(4K−3) ASW1 | G(4K−3) ASW2 | B(4K−3) ASW3 | R(4K−2) ASW1 | G(4K−2) ASW2 | B(4K−2) ASW3 |
|---|---|---|---|---|---|---|---|---|
| Driving Order (T1 → T2 → T3 → T4 → T5 → T6) | Odd-Numbered Frame | GL (Odd No.) | T1 | T2 | T3 | T1 | T2 | T3 |
| | | GL (Even No.) | T1 | T2 | T3 | T1 | T2 | T3 |
| | Even-Numbered Frame | GL (Odd No.) | T1 | T2 | T3 | T1 | T2 | T3 |
| | | GL (Even No.) | T1 | T2 | T3 | T1 | T2 | T3 |
| Number of Variations in Display Area | Odd-Numbered Frame | GL (Odd No.) | 2 | 1 | 0 | 2 | 1 | 1 |
| | | GL (Even No.) | 2 | 1 | 0 | 2 | 1 | 1 |
| | Even-Numbered Frame | GL (Odd No.) | 2 | 1 | 0 | 2 | 1 | 1 |
| | | GL (Even No.) | 2 | 1 | 0 | 2 | 1 | 1 |
| Number of Variations in Passage Area | Odd-Numbered Frame | GL (Odd No.) | 1 | 0 | 0 | 1 | 1 | 1 |
| | | GL (Even No.) | 1 | 0 | 0 | 1 | 1 | 1 |
| | Even-Numbered Frame | GL (Odd No.) | 1 | 0 | 0 | 1 | 1 | 1 |
| | | GL (Even No.) | 1 | 0 | 0 | 1 | 1 | 1 |

TABLE 1-continued

|  |  | SL<br>ASW between Video ⇔ SL | R(4K-1)<br>ASW4 | G(4K-1)<br>ASW5 | B(4K-1)<br>ASW6 | R(4K)<br>ASW4 | G(4K)<br>ASW5 | B(4K)<br>ASW6 |
|---|---|---|---|---|---|---|---|---|
| Driving Order<br>(T1 → T2 → T3 →<br>T4 → T5 → T6) | Odd-<br>Numbered<br>Frame | GL (Odd No.)<br>GL (Even No.) | T4<br>T4 | T5<br>T5 | T6<br>T6 | T4<br>T4 | T5<br>T5 | T6<br>T6 |
|  | Even-<br>Numbered<br>Frame | GL (Odd No.)<br>GL (Even No.) | T4<br>T4 | T5<br>T5 | T6<br>T6 | T4<br>T4 | T5<br>T5 | T6<br>T6 |
| Number of<br>Variations in<br>Display Area | Odd-<br>Numbered<br>Frame | GL (Odd No.)<br>GL (Even No.) | 1<br>1 | 1<br>1 | 0<br>0 | 2<br>2 | 1<br>1 | 0<br>0 |
|  | Even-<br>Numbered<br>Frame | GL (Odd No.)<br>GL (Even No.) | 1<br>1 | 1<br>1 | 0<br>0 | 2<br>2 | 1<br>1 | 0<br>0 |
| Number of<br>Variations in<br>Passage Area | Odd-<br>Numbered<br>Frame | GL (Odd No.)<br>GL (Even No.) | 0<br>0 | 0<br>0 | 0<br>0 | 1<br>1 | 1<br>1 | 0<br>0 |
|  | Even-<br>Numbered<br>Frame | GL (Odd No.)<br>GL (Even No.) | 0<br>0 | 0<br>0 | 0<br>0 | 1<br>1 | 1<br>1 | 0<br>0 |

Since the number of variations in the display area 17 is 0 to 2, as illustrated in Table 1, the difference between the maximum value and the minimum value of the number of variations in the display area 17 is 2. Also, since the number of variations in the passage area 14 is 0 to 1, the difference between the maximum value and the minimum value of the number of variations in the passage area 14 is 1.

Thus, compared with the active matrix substrate 101, which is illustrated in FIG. 12 and is a comparative example, the active matrix substrate 1 according to the first embodiment illustrated in FIG. 6 can reduce the maximum value of the number of variations in the passage area 14 and can reduce the difference in the number of variations in the passage area 14.

(Display Quality)

Herein, the "display quality" means uniformity of brightness and tint of display images.

Since the source lines SL are arranged in the display area 17 so as to correspond to a pixel pitch, the adjacent intervals of the source lines SL are relatively large. Thus, since a parasitic capacitance between the adjacent source lines SL is relatively small, the amount of variation per single variation is relatively small, and an influence on display images is also relatively small. Thus, even when the number of variations in the display area 17 is 2, it has almost no influence on the display quality.

However, in the inner non-display area 12, since the source lines SL bypass the opening area 11 formed in the opening 64, the adjacent intervals of the source lines SL are relatively small. Specifically, since the adjacent intervals of the source lines SL decrease gradually in each of the upper change area 13 and the lower change area 16, the adjacent intervals of the source lines SL in the passage area 14 are smaller than those in the inner non-display area 12.

Owing to such adjacent intervals, the parasitic capacitance between the source lines SL that are adjacent to each other in the passage area 14 is relatively large, and thus the amount of variation per single variation is relatively large, and an influence on display images is also relatively large. Thus, the display quality in the portion areas 15 corresponding to the source lines SL running through the inner non-display area 12 in the display area 17 declines, as the number of variations in the passage area 14 increases. In addition, in general, since the adjacent intervals of the source lines SL in the passage area 14 are noticeably small in order to reduce the inner non-display area 12, the display quality in the portion areas 15 in the display area 17 declines noticeably, as the number of variations in the passage area 14 increases.

The active matrix substrate 1 according to the first embodiment can reduce the maximum value of the number of variations in the passage area 14, as described above. Thus, it is possible to reduce a decline in the display quality in the portion areas 15 in the display area 17. In addition, since it is possible to reduce the difference between the maximum value and the minimum value of the number of variations in the passage area 14, it is possible to reduce the difference between the maximum value and the minimum value of the amount of decline in the display quality in the portion areas 15 in the display area 17. Such a difference in the amount of decline in the display quality in the portion areas 15 tends to be easily viewed as stripes that extend in the y-axis direction from the opening 64. Thus, reducing the difference in the amount of decline in the display quality in the portion areas 15 makes it difficult to view a decline in the display quality.

Accordingly, it is advantageous that the active matrix substrate 1 according to the first embodiment can reduce the maximum value of and the difference in the number of variations in the passage area 14.

In addition, in general, the number of variations in the display area 17 is unbalanced depending on the color, as in Table 1. Specifically, the number of variations in three of four red source lines R is 2, whereas the number of variations in three of four blue source lines B is 0. Thus, in the active matrix substrate 101 in which the arrangement of the source lines SL is not changed, as in FIG. 12, the difference in the amount of decline in the display quality in the portion areas 15 in the display area 17 tends to be more easily viewed as colored stripes.

Accordingly, it is generally more beneficial that the active matrix substrate 1 according to the first embodiment can reduce the maximum value of and the difference in the number of variations in the passage area 14.

(Modification)

The driving order of driving the source lines SL in a time-sharing manner is not limited to the above-described order and may be any driving order. In addition, the driving order may differ from one frame to another or may differ from one gate line GL to another.

Figure 9:
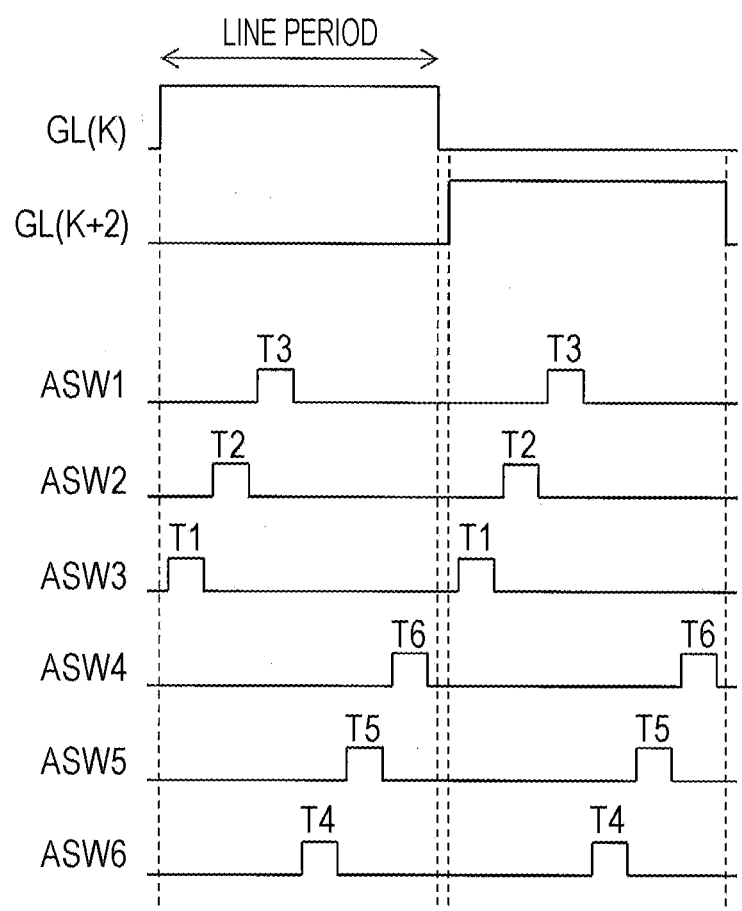
FIG. 9 is a signal diagram illustrating selection signals supplied to the first to sixth selection signal line, illustrated in FIG. 6, in another order, in contrast with gate signals supplied to the gate lines.

FIG. 9 is a signal diagram illustrating selection signals that are supplied to the first to sixth selection signal lines ASW1 to ASW6, illustrated in FIG. 6, in another order, in contrast with gate signals supplied to the gate lines GL.

Each gate signal in the gate lines GL is illustrated in FIG. 9 as being in a high (High) state in a line period in which the gate line GL is selectively driven and is illustrated in FIG. 9 as being in a low (Low) state in a line period in which the corresponding gate line GL is not driven. Also, each selection signal supplied to the first selection line ASW1 is illustrated in FIG. 9 as being in a high (High) state in a period in which the states between the drains and the sources of the corresponding first transistor TFT1 and the fourth transistor TFT4 are put into an electrically conductive state, and is illustrated in FIG. 9 as being in a low (Low) state in a period in which the states between the drains and the sources are put into an electrically non-conductive state. Similarly, the selection signals supplied to the second to sixth selection signal lines ASW2 to ASW6 are also illustrated in FIG. 9 as being in a high (High) state in a period in which the states between the drains and the sources of the corresponding second, third, and fifth to 12$^{th}$ transistors TFT2, TFT3, and TFT5 to TFT12 are put into an electrically conductive state, and are illustrated in FIG. 9 as being in a low (Low) state in a period in which the states between the drains and the sources are put into an electrically non-conductive state.

For example, when the parity of a frame and the parity of the gate line GL match each other, selection signals may be supplied to the first to sixth selection signal lines ASW1 to ASW6, as in FIG. 8, and when the parity of a frame and the parity of the gate line GL differ from each other, selection signals may be supplied to the first to sixth selection signal lines ASW1 to ASW6, as in FIG. 9.

Table 2 is a table illustrating the number of variations in the display area 17 and the passage area 14 according to a driving order in this modification.

TABLE 2

| | | SL<br>ASW between Video ⇔ SL | R(4K-3)<br>ASW1 | G(4K-3)<br>ASW2 | B(4K-3)<br>ASW3 | R(4K-2)<br>ASW1 | G(4K-2)<br>ASW2 | B(4K-2)<br>ASW3 |
|---|---|---|---|---|---|---|---|---|
| Driving Order (T1 → T2 → T3 → T4 → T5 → T6) | Odd-Numbered Frame | GL (Odd No.) | T1 | T2 | T3 | T1 | T2 | T3 |
| | | GL (Even No.) | T3 | T2 | T1 | T3 | T2 | T1 |
| | Even-Numbered Frame | GL (Odd No.) | T3 | T2 | T1 | T3 | T2 | T1 |
| | | GL (Even No.) | T1 | T2 | T3 | T1 | T2 | T3 |
| Number of Variations in Display Area | Odd-Numbered Frame | GL (Odd No.) | 2 | 1 | 0 | 2 | 1 | 1 |
| | | GL (Even No.) | 1 | 1 | 2 | 0 | 1 | 2 |
| | Even-Numbered Frame | GL (Odd No.) | 1 | 1 | 2 | 0 | 1 | 2 |
| | | GL (Even No.) | 2 | 1 | 0 | 2 | 1 | 1 |
| Number of Variations in Passage Area | Odd-Numbered Frame | GL (Odd No.) | 1 | 0 | 0 | 1 | 1 | 1 |
| | | GL (Even No.) | 1 | 1 | 1 | 0 | 0 | 1 |
| | Even-Numbered Frame | GL (Odd No.) | 1 | 1 | 1 | 0 | 0 | 1 |
| | | GL (Even No.) | 1 | 0 | 0 | 1 | 1 | 1 |
| | | SL<br>ASW between Video ⇔ SL | R(4K-1)<br>ASW4 | G(4K-1)<br>ASW5 | B(4K-1)<br>ASW6 | R(4K)<br>ASW4 | G(4K)<br>ASW5 | B(4K)<br>ASW6 |
| Driving Order (T1 → T2 → T3 → T4 → T5 → T6) | Odd-Numbered Frame | GL (Odd No.) | T4 | T5 | T6 | T4 | T5 | T6 |
| | | GL (Even No.) | T6 | T5 | T4 | T6 | T5 | T4 |
| | Even-Numbered Frame | GL (Odd No.) | T6 | T5 | T4 | T6 | T5 | T4 |
| | | GL (Even No.) | T4 | T5 | T6 | T4 | T5 | T6 |
| Number of Variations in Display Area | Odd-Numbered Frame | GL (Odd No.) | 1 | 1 | 0 | 2 | 1 | 0 |
| | | GL (Even No.) | 0 | 1 | 2 | 0 | 1 | 1 |
| | Even-Numbered Frame | GL (Odd No.) | 0 | 1 | 2 | 0 | 1 | 1 |
| | | GL (Even No.) | 1 | 1 | 0 | 2 | 1 | 0 |
| Number of Variations in Passage Area | Odd-Numbered Frame | GL (Odd No.) | 0 | 0 | 0 | 1 | 1 | 0 |
| | | GL (Even No.) | 0 | 1 | 1 | 0 | 0 | 0 |
| | Even-Numbered Frame | GL (Odd No.) | 0 | 1 | 1 | 0 | 0 | 0 |
| | | GL (Even No.) | 0 | 0 | 0 | 1 | 1 | 0 |

Since the number of variations in the display area 17 is 0 to 2, as illustrated in Table 2, the difference between the maximum value and the minimum value of the number of variations in the display area 17 is 2. Also, since the number of variations in the passage area 14 is 0 to 1, the difference between the maximum value and the minimum value of the number of variations in the passage area 14 is 1.

Accordingly, even when the driving order of the source lines SL is modified as described above, it is possible to reduce a decline in the display quality in the portion areas 15 in the display area 17, and it is also possible to reduce the difference between the maximum value and the minimum value of the amount of decline.

Second Embodiment

Another embodiment of the present invention will be described based on FIGS. 10 and 11, as follows. For convenience of description, members having the same functions as the members described in the above embodiment are denoted by the same reference numerals, and descriptions thereof are omitted.

Figure 10:
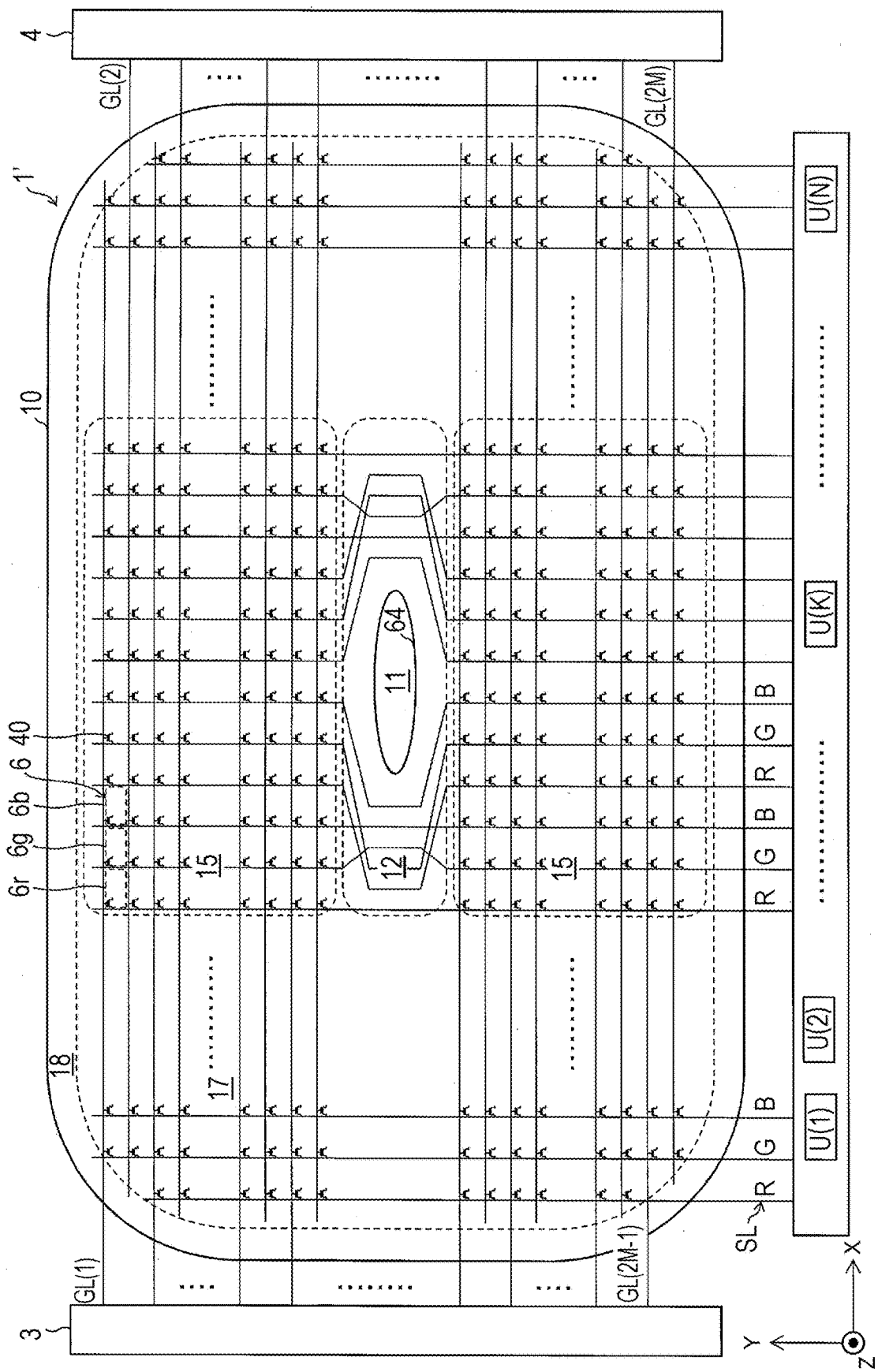
FIG. 10 is a plan view illustrating a schematic configuration of an active matrix substrate according to another embodiment of the present invention.

FIG. 10 is a plan view illustrating a schematic configuration of an active matrix substrate 1' according to a second embodiment. For convenience of illustration, illustration of gate lines GL that run through an inner non-display area 12, pixel electrodes 50, and so on is omitted.

As illustrated in FIG. 10, similarly to the active matrix substrate 1 according to the first embodiment described above, the active matrix substrate 1' according to the second embodiment comprises an insulating substrate 10, 2M gate lines GL, 12N source lines SL that intersect the gate lines GL, and pixel transistors 40 corresponding to the intersections of the gate lines GL and the source lines SL, and pixels 6. Similarly, the active matrix substrate 1' according to the second embodiment is connected to a source driver 2, an odd-numbered-gate driver 3, and an even-numbered-gate driver 4. M and N are natural numbers. Also, similarly, although illustration is omitted, the active matrix substrate 1' may comprise pixel electrodes 50, auxiliary capacitance lines that extend parallel to the gate lines GL, a common potential line that connects the common electrode 52 to ground, and so on.

The active matrix substrate 1' according to the second embodiment differs from the active matrix substrate 1 according to the first embodiment described above in only the arrangement of the source lines SL in the inner non-display area 12, and other configurations are the same as those in the active matrix substrate 1 according to the first embodiment.

(Arrangement of Source Lines)

Figure 11:
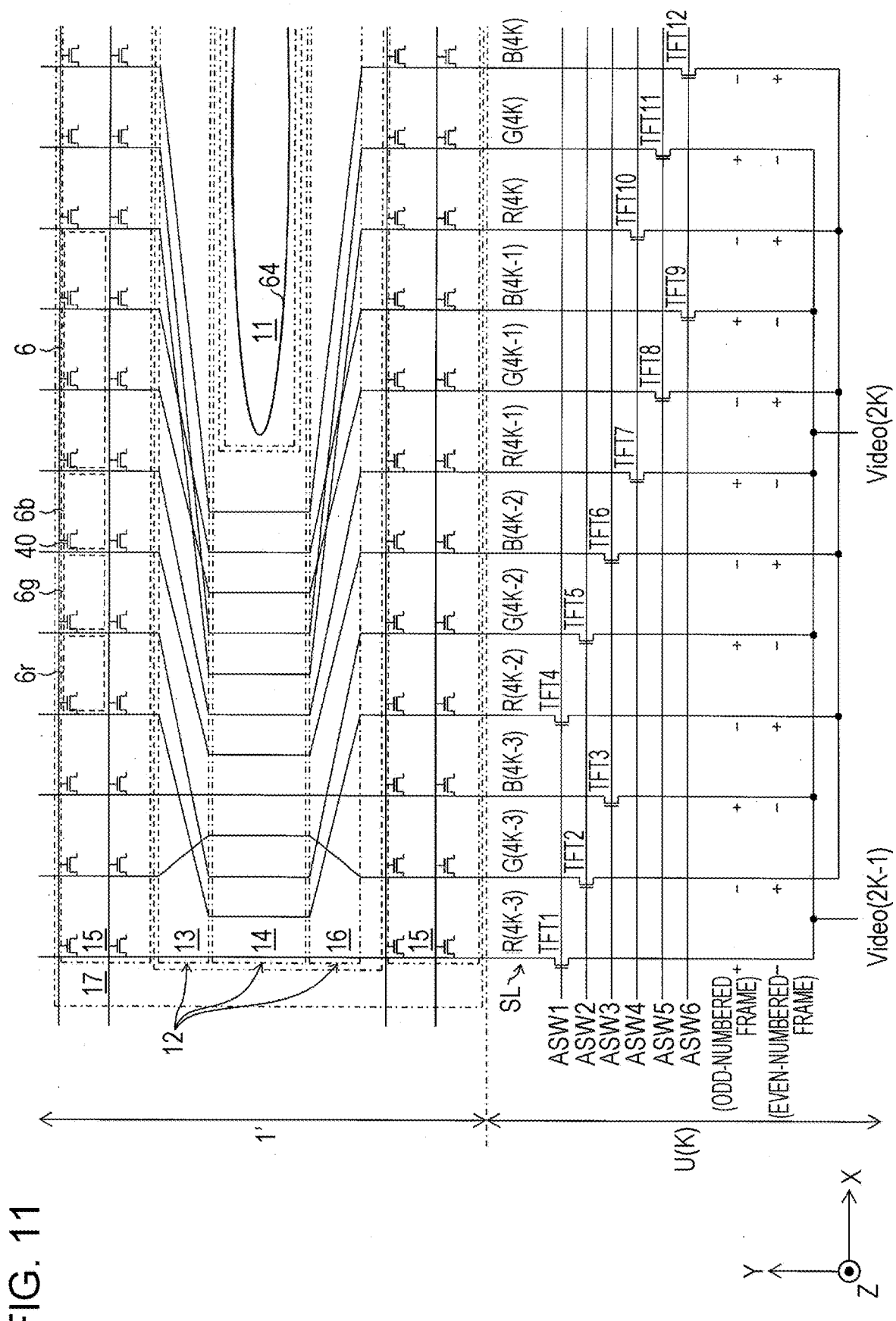
FIG. 11 is a plan view illustrating a schematic configuration of unit circuits in a source driver illustrated in FIG. 10 and source lines that are connected to the unit circuits and that run through an inner non-display area.

FIG. 11 is a plan view illustrating a schematic configuration of unit circuits U(K) illustrated in FIG. 10 and the source lines SL that are connected to the unit circuits U(K) and that also run through the inner non-display area 12. L is a natural number that is greater than or equal to 2 and that is smaller than or equal to K, and K is a natural number that is greater than or equal to 1 and that is smaller than or equal to N. For convenience of illustration, illustration of the gate lines GL that run through the inner non-display area 12, the pixel electrodes 50, and so on is omitted.

Since the unit circuits U(K) have been described above in the first embodiment above, descriptions thereof are omitted.

As illustrated in FIG. 11, the source lines SL are arranged in the display area 17 so as to repeat in the order red, green, and blue, whereas the source lines SL are arranged in the inner non-display area 12 so as to repeat in the order red, red, green, green, blue, and blue.

The arrangement of the source lines SL in the display area 17 according to the second embodiment is the same as the arrangement of the source lines SL in the display area 17 according to the first embodiment described above. The arrangement of the source lines SL in the passage area 14 according to the second embodiment differs from the arrangement of the source lines SL in the passage area 14 according to the first embodiment described above. In the passage area 14, the source lines SL according to the second embodiment are arranged in the direction from −x to +x in the following order from top to bottom.

The $(4K-3)^{th}$ red source line R(4K−3)
The $(4K-2)^{th}$ red source line R(4K−2)
The $(4K-2)^{th}$ green source line G(4K−2)
The $(4K-3)^{th}$ green source line G(4K−3)
The $(4K-3)^{th}$ blue source line B(4K−3)
The $(4K-2)^{th}$ blue source line B(4K−2)
The $(4K-1)^{th}$ red source line R(4K−1)
The $4K^{th}$ red source line R(4K)
The $4K^{th}$ green source line G(4K)
The $(4K-1)^{th}$ green source line G(4K−1)
The $(4K-1)^{th}$ blue source line B(4K−1)
The $4K^{th}$ blue source line B(4K)

Accordingly, the arrangement of the source lines SL according to the second embodiment is the same as the arrangement of the source lines SL according to the first embodiment described above in that (i) colors corresponding to the source lines SL that are adjacent to each other in the display area 17 differ from each other and (ii) each source line SL in the passage area 14 is adjacent, at one side, to another source line SL that corresponds to the same color and that is simultaneously driven. At the same time, the arrangement of the source lines SL according to the second embodiment differs from the arrangement of the source lines SL according to the first embodiment described above in that (i) the order of the $(4K-3)^{th}$ green source line G(4K−3) and the $(4K-2)^{th}$ green source line G(4K−2) is interchanged and (ii) the order of the $(4K-1)^{th}$ green source line G(4K−1) and the $4K^{th}$ green source line G(4K) is interchanged.

Therefore, in each of the upper change area 13 and the lower change area 16, some of the source lines SL that run through the inner non-display area 12 intersect each other as in the first embodiment described above and also intersect each other as described below, so that the arrangement of the source lines SL according to the second embodiment is changed.

The $(4K-3)^{th}$ green source line G(4K−3) and the $(4K-2)^{th}$ green source line G(4K−2)
The $(4K-1)^{th}$ green source line G(4K−1) and the $4K^{th}$ green source line G(4K)

As a result, the source lines SL are arranged so that the source lines that are driven in a polarity reversal manner by one-column reversal driving system are reversed every source line SL in both the display area 17 and the passage area 14.

The arrangement and an arrangement change of the source lines SL are not limited to those described above, and any arrangement or any arrangement change may be made as long as three conditions described below are satisfied.

The source lines SL are arranged in the display area 17 so that the source lines SL that are adjacent to each other in the display area 17 are driven at different times.

The source lines SL are arranged in the passage area 14 so that each source line SL that runs through the inner non-display area 12 is adjacent, at at least one side, to another source line SL that is in the passage area 14 and that is simultaneously driven.

The source lines SL are arranged in the passage area 14 so that an odd-numbered source line SL and an even-numbered source lines SL are alternately disposed also in the passage area 14 when 4N source lines SL are counted in the direction from −x to +x in the display area 17 without discriminating among the red source lines R, the green source lines G, and the blue source lines B.

Also, the source lines SL may be driven in a polarity reversal manner by not only the one-column reversal driving system but also any system as long as the polarities of source signals that are supplied to the source lines SL are reversed every source line SL in the arrangement of the source lines SL in the display area 17.

(Driving Order of Source Lines)

The driving order of driving the source lines SL in a time-sharing manner complies with selection signals supplied to the first to sixth selection signal lines ASW1 to ASW6.

With regard to the first to sixth selection signal lines ASW1 to ASW6 illustrated in FIG. 11, the selection signals are also supplied to the first to sixth selection signal lines ASW1 to ASW6, as in FIG. 8, regardless of the parities of the frame and the gate lines GL, as in the first embodiment described above. Thus, the source lines SL according to the second embodiment are sequentially driven from T1 to T6, in the same manner as the source lines SL according to the first embodiment described above.

(The Number of Variations)

Table 3 is a table illustrating the number of variations in the display area 17 and the passage area 14 according to the above-described arrangement and driving order of the source lines SL.

the active matrix substrate 1' according to the second embodiment illustrated in FIG. 11 can reduce the maximum value of the number of variations in the passage area 14 and can reduce the difference in the number of variations in the passage area 14.

(Direction of Variation)

As described above in the first embodiment above, the potential in each source line SL varies owing to driving of another source line SL that is adjacent to the source line SL after the driving of the source line SL.

Herein, the "direction of variation" means the direction in which the potential in a certain source line SL in a certain line period varies owing to driving of another source line SL that is adjacent to the certain source line SL after driving of the certain source line SL, unless the "direction of variation" is described as having another means. Also, the "direction of variation in a certain area" means the direction in which the potential in a certain source line SL in a certain line period varies owing to driving of another source line SL that is

TABLE 3

| | | SL<br>ASW between Video ⇔ SL | R(4K-3)<br>ASW1 | G(4K-3)<br>ASW2 | B(4K-3)<br>ASW3 | R(4K-2)<br>ASW1 | G(4K-2)<br>ASW2 | B(4K-2)<br>ASW3 |
|---|---|---|---|---|---|---|---|---|
| Driving Order<br>(T1 → T2 → T3 →<br>T4 → T5 → T6) | Odd-<br>Numbered<br>Frame | GL (Odd No.)<br>GL (Even No.) | T1<br>T1 | T2<br>T2 | T3<br>T3 | T1<br>T1 | T2<br>T2 | T3<br>T3 |
| | Even-<br>Numbered<br>Frame | GL (Odd No.)<br>GL (Even No.) | T1<br>T1 | T2<br>T2 | T3<br>T3 | T1<br>T1 | T2<br>T2 | T3<br>T3 |
| Number of<br>Variations in<br>Display Area | Odd-<br>Numbered<br>Frame | GL (Odd No.)<br>GL (Even No.) | 2<br>2 | 1<br>1 | 0<br>0 | 2<br>2 | 1<br>1 | 1<br>1 |
| | Even-<br>Numbered<br>Frame | GL (Odd No.)<br>GL (Even No.) | 2<br>2 | 1<br>1 | 0<br>0 | 2<br>2 | 1<br>1 | 1<br>1 |
| Number of<br>Variations in<br>Passage Area | Odd-<br>Numbered<br>Frame | GL (Odd No.)<br>GL (Even No.) | 1<br>1 | 0<br>0 | 0<br>0 | 1<br>1 | 1<br>1 | 1<br>1 |
| | Even-<br>Numbered<br>Frame | GL (Odd No.)<br>GL (Even No.) | 1<br>1 | 0<br>0 | 0<br>0 | 1<br>1 | 1<br>1 | 1<br>1 |

| | | SL<br>ASW between Video ⇔ SL | R(4K-1)<br>ASW4 | G(4K-1)<br>ASW5 | B(4K-1)<br>ASW6 | R(4K)<br>ASW4 | G(4K)<br>ASW5 | B(4K)<br>ASW6 |
|---|---|---|---|---|---|---|---|---|
| Driving Order<br>(T1 → T2 → T3 →<br>T4 → T5 → T6) | Odd-<br>Numbered<br>Frame | GL (Odd No.)<br>GL (Even No.) | T4<br>T4 | T5<br>T5 | T6<br>T6 | T4<br>T4 | T5<br>T5 | T6<br>T6 |
| | Even-<br>Numbered<br>Frame | GL (Odd No.)<br>GL (Even No.) | T4<br>T4 | T5<br>T5 | T6<br>T6 | T4<br>T4 | T5<br>T5 | T6<br>T6 |
| Number of<br>Variations in<br>Display Area | Odd-<br>Numbered<br>Frame | GL (Odd No.)<br>GL (Even No.) | 1<br>1 | 1<br>1 | 0<br>0 | 2<br>2 | 1<br>1 | 0<br>0 |
| | Even-<br>Numbered<br>Frame | GL (Odd No.)<br>GL (Even No.) | 1<br>1 | 1<br>1 | 0<br>0 | 2<br>2 | 1<br>1 | 0<br>0 |
| Number of<br>Variations in<br>Passage Area | Odd-<br>Numbered<br>Frame | GL (Odd No.)<br>GL (Even No.) | 0<br>0 | 0<br>0 | 0<br>0 | 1<br>1 | 1<br>1 | 0<br>0 |
| | Even-<br>Numbered<br>Frame | GL (Odd No.)<br>GL (Even No.) | 0<br>0 | 0<br>0 | 0<br>0 | 1<br>1 | 1<br>1 | 0<br>0 |

Since the number of variations in the display area 17 is 0 to 2, as illustrated in Table 3, the difference between the maximum value and the minimum value of the number of variations in the display area 17 is 2. Also, since the number of variations in the passage area 14 is 0 to 1, the difference between the maximum value and the minimum value of the number of variations in the passage area 14 is 1.

Thus, compared with the active matrix substrate 101, which is illustrated in FIG. 12 and is a comparative example, adjacent to the certain source line SL in a certain area after driving of the certain source line SL, unless the "direction of variation in a certain area" is described as having another means. Examples of the "certain area" include the display area 17 and the passage area 14.

As is well known, the direction of variation in the potential in a certain source line SL has a polarity that is the same as the polarity of the source signal supplied to the source line SL that is adjacent to the certain source lines SL.

According to the above-described arrangement of the source lines SL, the polarities of the source signals supplied to the source lines SL are reversed every source line SL in both the display area 17 and the passage area 14. Accordingly, in the second embodiment, the direction of variation in the potential in each source line SL in the passage area 14 has a polarity that is invariably opposite to the polarity of the source signal in the source line SL.

(The Number of Variations and Display Quality)

As illustrated in Table 3, the active matrix substrate 1' according to the second embodiment can reduce the maximum value of the number of variations in the passage area 14 and can reduce the difference in the number of variations in the passage area 14, as in the active matrix substrate 1 according to the first embodiment described above. Accordingly, it is possible to reduce a decline in the display quality in the portion areas 15 in the display area 17, and it is also possible to reduce the difference between the maximum value and the minimum value of the amount of decline.

(Direction of Variation and Display Quality)

As is well known, an influence that a variation in the potential in the source line SL has on display images differs depending on whether it has a polarity that is the same as or opposite to the polarity of a source signal in the source line SL. For example, in a normally black type display device, when the direction of variation in the potential in a certain source line SL has a polarity that is the same as the polarity of a source signal in the source line SL, the pixels corresponding to the source line SL are high in brightness, that is, become bright. In contrast, when the direction of variation in the potential in a certain source line SL has a polarity that is opposite to the polarity of a source signal in the source line SL, the pixels corresponding to the source line SL are low in brightness, that is, become dark. Thus, in a configuration in which a source line SL whose direction of variation has a polarity that is the same as the polarity of a source signal therein and a source line SL whose direction of variation has a polarity that is opposite to the polarity of a source signal therein coexist, pixels that become bright and pixels that become dark coexist, thus promoting a decline in the display quality.

As described above, according to the active matrix substrate 1' according to the second embodiment, the direction of variation in the potential of a certain source line SL in the passage area 14 is aligned to have a polarity that is opposite to the polarity of a source signal therein. Thus, the active matrix substrate 1' according to the second embodiment can reduce a decline in the display quality, compared with the active matrix substrate 1 according to the first embodiment described above.

(Modification)

The driving order of driving the source lines SL in a time-sharing manner is not limited to the above-described order and may be any driving order. In addition, the driving order may differ from one frame to another or may differ from one gate line GL to another.

For example, when the parity of a frame and the parity of the gate line GL match each other, selection signals may be supplied to the first to sixth selection signal lines ASW1 to ASW6, as in FIG. 8, and when the parity of a frame and the parity of the gate line GL differ from each other, selection signals may be supplied to the first to sixth selection signal lines ASW1 to ASW6, as in FIG. 9.

Table 4 illustrates the number of variations in the display area 17 and the passage area 14 according to a driving order in this modification.

TABLE 4

| | | SL<br>ASW between Video ⇔ SL | R(4K-3)<br>ASW1 | G(4K-3)<br>ASW2 | B(4K-3)<br>ASW3 | R(4K-2)<br>ASW1 | G(4K-2)<br>ASW2 | B(4K-2)<br>ASW3 |
|---|---|---|---|---|---|---|---|---|
| Driving Order<br>(T1 → T2 → T3 →<br>T4 → T5 → T6) | Odd-<br>Numbered<br>Frame | GL (Odd No.)<br>GL (Even No.) | T1<br>T3 | T2<br>T2 | T3<br>T1 | T1<br>T3 | T2<br>T2 | T3<br>T1 |
| | Even-<br>Numbered<br>Frame | GL (Odd No.)<br>GL (Even No.) | T3<br>T1 | T2<br>T2 | T1<br>T3 | T3<br>T1 | T2<br>T2 | T1<br>T3 |
| Number of<br>Variations in<br>Display Area | Odd-<br>Numbered<br>Frame | GL (Odd No.)<br>GL (Even No.) | 2<br>1 | 1<br>1 | 0<br>2 | 2<br>0 | 1<br>1 | 1<br>2 |
| | Even-<br>Numbered<br>Frame | GL (Odd No.)<br>GL (Even No.) | 1<br>2 | 1<br>1 | 2<br>0 | 0<br>2 | 1<br>1 | 2<br>1 |
| Number of<br>Variations in<br>Passage Area | Odd-<br>Numbered<br>Frame | GL (Odd No.)<br>GL (Even No.) | 1<br>1 | 0<br>1 | 0<br>1 | 1<br>0 | 1<br>0 | 1<br>1 |
| | Even-<br>Numbered<br>Frame | GL (Odd No.)<br>GL (Even No.) | 1<br>1 | 1<br>0 | 1<br>0 | 0<br>1 | 0<br>1 | 1<br>1 |

| | | SL<br>ASW between Video ⇔ SL | R(4K-1)<br>ASW4 | G(4K-1)<br>ASW5 | B(4K-1)<br>ASW6 | R(4K)<br>ASW4 | G(4K)<br>ASW5 | B(4K)<br>ASW6 |
|---|---|---|---|---|---|---|---|---|
| Driving Order<br>(T1 → T2 → T3 →<br>T4 → T5 → T6) | Odd-<br>Numbered<br>Frame | GL (Odd No.)<br>GL (Even No.) | T4<br>T6 | T5<br>T5 | T6<br>T4 | T4<br>T6 | T5<br>T5 | T6<br>T4 |
| | Even-<br>Numbered<br>Frame | GL (Odd No.)<br>GL (Even No.) | T6<br>T4 | T5<br>T5 | T4<br>T6 | T6<br>T4 | T5<br>T5 | T4<br>T6 |
| Number of<br>Variations in<br>Display Area | Odd-<br>Numbered<br>Frame | GL (Odd No.)<br>GL (Even No.) | 1<br>0 | 1<br>1 | 0<br>2 | 2<br>0 | 1<br>1 | 0<br>1 |
| | Even-<br>Numbered<br>Frame | GL (Odd No.)<br>GL (Even No.) | 0<br>1 | 1<br>1 | 2<br>0 | 0<br>2 | 1<br>1 | 1<br>0 |

TABLE 4-continued

| Number of Variations in Passage Area | Odd-Numbered Frame | GL (Odd No.) | 0 | 0 | 0 | 1 | 1 | 0 |
|---|---|---|---|---|---|---|---|---|
| | | GL (Even No.) | 0 | 1 | 1 | 0 | 0 | 0 |
| | Even-Numbered Frame | GL (Odd No.) | 0 | 1 | 1 | 0 | 0 | 0 |
| | | GL (Even No.) | 0 | 0 | 0 | 1 | 1 | 0 |

Since the number of variations in the display area 17 is 0 to 2, as illustrated in Table 4, the difference between the maximum value and the minimum value of the number of variations in the display area 17 is 2. Also, since the number of variations in the passage area 14 is 0 to 1, the difference between the maximum value and the minimum value of the number of variations in the passage area 14 is 1.

Accordingly, even when the driving order of the source lines SL is modified as described above, it is possible to reduce a decline in the display quality in the portion areas 15 in the display area 17, and it is also possible to reduce the difference between the maximum value and the minimum value of the amount of decline. In addition, according to the active matrix substrate 1' according to the second embodiment, even when the driving order of the source lines SL is modified as described above, the direction of variation in the potential in a certain source line SL in the passage area 14 is aligned to have a polarity that is opposite to the polarity of a source signal therein. Thus, the active matrix substrate 1' according to the second embodiment can reduce a decline in the display quality, compared with the active matrix substrate 1 according to the first embodiment described above.

SUMMARY

An active matrix substrate (1, 1') according to aspect 1 of the present invention has a configuration comprising: a substrate (an insulating substrate 10) in which an opening area (11), an inner non-display area (12) outside of the opening area, and a display area (17) outside of the inner non-display area are set; a plurality of gate lines (GL) and a plurality of source lines (the source lines SL, the red source line R, the green source line G, and the blue source line B) that intersects the gate lines, the gate lines and the source lines extending on the substrate so as to bypass the opening area; and a plurality of pixel transistors (40) that is provided in the display area on the substrate so as to correspond to intersections of the gate lines and the source lines in only the display area. The source lines include a plurality of sets, each including the source lines of a first type to a $P^{th}$ type, where P is a natural number greater than or equal to 2; the source lines of the same type are simultaneously driven; the source lines included in the same set are driven in a time-sharing manner; the source lines that are adjacent to each other in the display area are of types that are different from each other; the inner non-display area includes first sections (the upper change area 13 and the lower change area 16) and a second section (the passage area 14); and the source lines that run through the inner non-display area are changed in arrangement in the first section and are arranged so that, in the second section, each source line is adjacent to another source line at at least one side.

According to the above-described configuration, since the gate lines and the source lines extend so as to bypass the opening area, an opening can be easily formed in the opening area.

According to the above-described configuration, the pixel transistors are provided in the display area on the substrate so as to correspond to the intersections of the gate lines and the source lines in only the display area. Thus, the arrangement of the source lines in the inner non-display area does not influence display images on a display device using the active matrix substrate. Accordingly, the arrangement of the source lines can be changed in the first sections in the inner non-display area. Also, the arrangement of the source lines in the second section in the inner non-display area can differ from the arrangement of the source lines in the display area.

According to the above-described configuration, each set includes the source lines of the first type to the $P^{th}$ type, and the source lines of the same type are simultaneously driven, and the source lines included in the same set are driven in a time-sharing manner. Thus, the source lines of different types are driven at different times. Also, according to the above-described configuration, the source lines that are adjacent to each other in the display area are of types that are different from each other. Thus, the source lines that are adjacent to each other in the display area are driven at different times. Accordingly, the number of variations in the display area is 0 to 2, and the difference in the number of variations in the display area is 2.

According to the above-described configuration, the source lines of the same type are simultaneously driven, and the source lines that run through the inner non-display area are changed in arrangement in the first sections and are arranged so that, in the second section, each source line is adjacent to another source line at at least one side. Thus, each source line is driven simultaneously with at least one of two source lines that are adjacent to the source line in the second section. Accordingly, the number of variations in the second section is 0 to 1, and the difference in the number of variations in the second section is 1.

As a result of such change of the arrangement of the source lines, the number of variations in the second section and its difference can be reduced compared with the number of variations in the display area and its difference. Thus, since the amount of variation in the potential in each source line and its difference can be reduced, it is possible to reduce a decline in the display quality in portion areas corresponding to the source lines that run through the inner non-display area in display area, and it is also possible to reduce the difference in the amount of decline.

An active matrix substrate (1, 1') according to aspect 2 of the present invention may have a configuration in which, in aspect 1 described above, the source lines (SL) of the same type correspond to the same color.

According to the above-described configuration, the source lines of the same type correspond to the same color. Also, a control circuit that sequentially supplies source signals to a source driver that drives the source lines generally simultaneously supply source signals corresponding to the same color. Accordingly, a general control circuit and a general source driver can be used.

An active matrix substrate (1, 1') according to aspect 3 of the present invention may have a configuration in which, in aspect 1 or 2 described above, the source lines (SL) that are adjacent to each other in the display area (17) correspond to colors that are different from each other.

According to the above-described configuration, the source lines that are adjacent to each other in the display area correspond to colors that are different from each other. Thus, since the colors are spatially mixed, it is possible to prevent color breakup in the display device. The source lines of different types which are not adjacent to each other in the display area may correspond to the same color to each other.

An active matrix substrate (1') according to aspect 4 of the present invention may have a configuration in which, in any one of aspects 1 to 3 described above, the source lines (SL) include the source lines that are odd-numbered and the source lines that are even-numbered, and the odd-numbered source lines and the even-numbered source lines are alternately disposed in both the display area and the second section.

According to the above-described configuration, the odd-numbered source lines and the even-numbered source lines are alternately disposed in the display area. Thus, when the polarities of source signals supplied to the source lines are reversed every source line, for example, when the source lines are driven in a polarity reversal manner by a one-column reversal driving system, the polarities of source signals supplied to the odd-numbered source lines have polarities that are opposite to the polarities of source signals supplied to the even-numbered source lines.

Also, according to the above-described configuration, the odd-numbered source lines and the even-numbered source lines are alternately disposed in the second section. Thus, when the polarities of source signals supplied to the source lines are reversed every source line, the polarities of source signals supplied to the source lines that are adjacent to each other in the second section have polarities that are opposite to each other.

As is well known, the direction of variation in the potential in a source line has a polarity that is opposite to the polarity of a source signal supplied to a source line that is adjacent to that source line. Also, an influence that a variation in the potential in a source line has on display images differs depending on whether it has a polarity that is the same as or opposite to the polarity of a source signal in the source line. For example, in a normally black type display device, when the direction of variation in the potential in a certain source line SL has a polarity that is the same as the polarity of a source signal in the source line SL, the pixels corresponding to the source line SL are high in brightness, that is, become bright. In contrast, when the direction of variation in the potential in a certain source line SL has a polarity that is opposite to the polarity of a source signal in the source line SL, the pixels corresponding to the source line SL are low in brightness, that is, become dark. Thus, in a configuration in which a source line SL whose direction of variation has a polarity that is the same as the polarity of a source signal therein and a source line SL whose direction of variation has a polarity that is opposite to the polarity of a source signal therein coexist, pixels that become bright and pixels that become dark coexist, thus promoting a decline in the display quality.

According to the above-described configuration, when the polarities of source signals supplied to the source lines are reversed every source line, the polarities of source signals supplied to the source lines that are adjacent to each other in the second section have polarities that are opposite to each other. Thus, since the direction of variation in the potential in a certain source line in the second section is inevitably opposite to the polarity of a source signal therein, it is possible to reduce a decline in the display quality in portion areas corresponding to the source lines that run through the inner non-display area in the display area.

An active matrix substrate (1, 1') according to aspect 5 of the present invention may have a configuration in which, in any one of aspects 1 to 4 described above, some of the source lines that run through the inner non-display area (12) intersect each other in the first sections (the upper change area 13 and the lower change area 16) to thereby change the arrangement of the source lines (SL) that run through the inner non-display area.

According to the above-described configuration, some of the source lines that run through the inner non-display area intersect each other, and the remainder of the source lines that run through the inner non-display area do not intersect other source lines.

An active matrix substrate (1, 1') according to aspect 6 of the present invention may have a configuration in which, in any one of aspects 1 to 5 described above, the source lines (SL) include at least one pair, each pair having a first set including the source lines of the first type to the $P^{th}$ type and a second set including the source lines of the first type to the $P^{th}$ type; the pairs are sequentially arranged from one side (−x direction) to another side (+x direction) in an extending direction of the gate lines (GL); and the source lines of the same type that are included in each pair sandwich, in the display area (17), the source lines of different types that are included in the pair, and are adjacent to each other in the second section (the passage area 14).

According to the above-described configuration, the pairs are sequentially arranged from one side to another side in the extending direction of the gate lines. Accordingly, the source lines can be arranged or can be changed in its arrangement for each pair. Also, any two source lines included in each pair do not sandwich the source lines included in another pair. Specifically, any two source lines that are included in each pair are adjacent to each other, intersect each other, or sandwich only the other source line included in the same pair.

According to the above-described configuration, each pair includes a first set including source lines of the first type to the $P^{th}$ type and a second set including source lines of the first type to the $P^{th}$ type. Thus, since each pair includes two source lines of each same type, the source lines can be driven for each pair in a polarity reversal manner.

According to the above-described configuration, since the source lines of the same type that are included in each pair sandwich, in the display area, the source lines of a different type that are included in the pair, the source lines that are adjacent to each other in the display area can be of types that are different from each other.

According to the above-described configuration, the source lines of the same type that are included in each pair are adjacent to each other in the second section, and thus, in the second section, each source line can be adjacent to another source line of the same type at at least one side.

An active matrix substrate (1') according to aspect 7 of the present invention may have a configuration in which, in aspect 6 described above, P=6 is given, and the arrangement of the source lines (SL) in each pair is in the order of the first type to the third type (($4K-3)^{th}$ red source line R(4K−3), the green source line G(4K−3), and the blue source line B(4K−3)) in the first set, the first type to the third type (($4K-2)^{th}$ red source line R(4K−2), the green source line G(4K−2), and the blue source line B(4K−2)) in the second set, the fourth type to the sixth type (($4K-1)^{th}$ red source line R(4K−1), the green source line G(4K−1), and the blue source line B(4K−1)) in the first set, the fourth type to the sixth type (4K$^{th}$ red source line R(4K), the green source line G(4K), and the blue source line B(4K)) in the second set in the display area (17) from one side (−x direction) to another side (+x direction) in the extending direction of the gate lines (GL), and is in an order of the first type ((4K−3)$^{th}$ red source line R(4K−3) in the first set, the first type to the second type ((4K−2)$^{th}$ red source line R(4K−2) and the green source line G(4K−2)) in the second set, the second type to the third type ((4K−3)$^{th}$ green source line G(4K−3) and the blue source line B(4K−3)) in the first set, the third type ((4K−2)$^{th}$ blue source line B(4K−2)) in the second set, the fourth type ((4K−1)$^{th}$ red source line R(4K−1)) in the first set, the fourth type to the fifth type (4K$^{th}$ red source line R(4K) and the green source line G(4K)) in the second set, the fifth type to the sixth type ((4K−1)$^{th}$ green source line G(4K−1) and the blue source line B(4K−1)) in the first set, and the sixth type (4K$^{th}$ blue source line B(4K)) in the second set in the second section from the one side to the other side in the extending direction of the gate lines.

An active matrix substrate (1, 1') according to aspect 8 of the present invention has a configuration in which, in any one of aspects 1 to 7, P=6 is given, the source lines (the red source lines R) of the first type and the fourth type correspond to a first color (red), the source lines (the green source lines G) of the second type and the fifth type correspond to a second color (green), the source lines (the blue source lines B) of the third type and the sixth type correspond to a third color (blue), and the first color to the third color are colors that are different from each other.

According to the above-described configuration, the source lines of the first type and the fourth type correspond to the first color, the source lines of the second type and the fifth type correspond to the second color, the source lines of the third type and the sixth type correspond to the third color, and the first color to the third color are colors that are different from each other. Thus, it is possible to realize an active matrix substrate that is suitable for a display device that displays the three primary colors.

For example, the first color, the second color, and the third color may be red, green, and blue in no particular order.

An active matrix substrate (1, 1') according to aspect 9 of the present invention may have a configuration in which, in any one of aspects 1 to 8 described above, the second section (the passage area 14) may be sandwiched between the first sections (the upper change area 13 and the lower change area 16) in an extending direction (a y-axis direction) of the source lines (SL).

According to the above-described configuration, the second section is sandwiched between the first sections in the extending direction of the source lines. Thus, the source lines that run through the inner non-display area can extend so as to pass through the display area, the first section, the second section, the first section, and the display area in that order in one side to another side in the extending direction of the source lines.

Owing to passing in such an order, the arrangement of the source lines can be changed in the first sections so that the arrangement of the source lines in the second section in the inner non-display area differs from the arrangement of the source lines in the display area.

An active matrix substrate (1, 1') according to aspect 10 of the present invention has a configuration comprising: a substrate (the insulating substrate 10) in which an opening area (11), an inner non-display area (12) outside of the opening area, and a display area (17) outside of the inner non-display area are set; a plurality of gate lines (GL) and a plurality of source lines (the source lines SL, the red source lines R, the green source lines G, the blue source lines B) that intersects the gate lines, the gate lines and the source lines extending on the substrate so as to bypass the opening area; and a plurality of pixel transistors (40) that is provided in the display area on the substrate so as to correspond to intersections of the gate lines and the source lines in only the display area. The source lines include the source lines (the red source lines R) corresponding to a first color (red), the source lines (the green source lines G) corresponding to a second color (green), and the source lines (the blue source lines B) corresponding to a third color (blue), and are arranged so that the corresponding colors repeat in the display area in an order of the first color, the second color, and the third color. The inner non-display area includes first sections (the upper change area 13 and the lower change area 16) and a second section (the passage area 14). The source lines that run through the inner non-display area are changed in arrangement in the first sections and are arranged in the second section so that the corresponding colors repeat in an order of the first color, the first color, the second color, the second color, the third color, and the third color.

According to the above-described configuration, it is possible to offer an advantage that is analogous to that in aspects 1, 2, and 6 described above. The first color, the second color, and the third color are, preferably, colors that are different from each other in order to offer an advantage that is analogous to that in aspects 3 and 8 described above and are, more preferably, red, green, and blue in no particular order.

In addition, a configuration that is analogous to that in aspect 4 described above can offer an advantage that is analogous to that in aspect 4 described above. Also, a configuration that is analogous to that in aspect 5 described above can offer an advantage that is analogous to that in aspect 5 described above. Also, a configuration that is analogous to that in aspect 6 described above can offer an advantage that is analogous to that in aspect 6 described above. Also, a configuration that is analogous to that in aspect 9 described above can offer an advantage that is analogous to that in aspect 9 described above.

An active matrix substrate (1, 1') according to aspect 11 of the present invention may have a configuration in which, in aspects 1 to 10 described above, the source lines (SL) include a plurality of sets, each including the source lines of a first type to a P$^{th}$ type, where P is natural number greater than or equal to 3. With a natural number K, the source lines (the red source lines R) of the (3K−2)$^{th}$ type correspond to the first color (red), the source lines (the green source lines of the G) of the (3K−1)$^{th}$ type correspond to the second color (green), and the source lines (the blue source lines B) of the (3K)$^{th}$ type correspond to the third color (blue). The source lines that run through the inner non-display area (12) are arranged so that, in the second section (the passage area 14), each source line is adjacent to another source line at at least one side.

A display device (the liquid-crystal display panel 70) according to aspect 12 of the present invention has a configuration comprising the active matrix substrate (1, 1') in any of aspects 1 to 11 described above.

A display device (the liquid-crystal display panel 70) according to aspect 13 of the present invention has a configuration comprising: the active matrix substrate (1, 1') in any one of aspects 1 to 9 and 11 described above; and a source driver (2) that simultaneously drives the source lines (SL) and that drives the source lines in a time-sharing manner.

The present invention is not limited to each embodiment described above, various changes are possible within the scope recited in the claims, and embodiments obtained by appropriately combining the technical means respectively disclosed in different embodiments are also encompassed by the technical scope of the present invention. In addition, new technical features can be formed by combining the technical means respectively disclosed in the embodiments.

REFERENCE SIGNS LIST 1, 1', 101 active matrix substrate
2 source driver
3 odd-numbered-gate driver
4 even-numbered-gate driver
6 pixel
6b blue sub-pixel
6g green sub-pixel
6r red sub-pixel
10 insulating substrate
11 opening area
12 inner non-display area
13 upper change area (first section)
14 passage area (second section)
15 portion area
16 lower change area (first section)
17 display area
18 outer non-display area
20 buffer layer
21 semiconductor layer
22 gate insulating film
23 gate layer
24 first interlayer insulating film
25 source layer
26 second interlayer insulating film
27 first transparent electrically conductive layer
28 third interlayer insulating film
29 second transparent electrically conductive layer
40 pixel transistor
41 gate electrode of pixel transistor
42 source electrode of pixel transistor
43 drain electrode of pixel transistor
44 channel for pixel transistor
50 pixel electrode
52 common electrode
64 opening
70 liquid-crystal display panel
71 opposing substrate
72 liquid-crystal layer
73 sealant
76 control circuit
80 wristwatch
81 hour hand
82 minute hand
83 second hand
84 drive shaft
85 inner frame
86 case
ASW1 first selection line
ASW2 second selection line
ASW3 third selection line
ASW4 fourth selection line
ASW5 fifth selection line
ASW6 sixth selection line
B blue source line
G green source line
GL gate line
R red source line
SL source line
TFT1 first transistor
TFT2 second transistor
TFT3 third transistor
TFT4 fourth transistor
TFT5 fifth transistor
TFT6 sixth transistor
TFT7 seventh transistor
TFT8 eighth transistor
TFT9 ninth transistor
TFT10 tenth transistor
TFT11 $11^{th}$ transistor
TFT12 $12^{th}$ transistor
Video source signal supply line

The invention claimed is:

1. An active matrix substrate comprising:
a substrate in which an opening area, an inner non-display area outside of the opening area, and a display area outside of the inner non-display area are set;
a plurality of gate lines and a plurality of source lines that intersects the gate lines, the gate lines and the source lines extending on the substrate so as to bypass the opening area; and
a plurality of pixel transistors that is provided in the display area on the substrate so as to correspond to intersections of the gate lines and the source lines in only the display area,
wherein the source lines include a plurality of sets, each including the source lines of a first type to a $P^{th}$ type, where P is a natural number greater than or equal to 2;
the source lines of the same type are simultaneously driven;
the source lines included in the same set are driven in a time-sharing manner;
the source lines that are adjacent to each other in the display area are of types that are different from each other;
the inner non-display area includes first sections and a second section; and
the source lines that run through the inner non-display area
are changed in arrangement in the first sections, and
are arranged so that, in the second section, each source line is adjacent to another source line of the same type at at least one side.

2. The active matrix substrate according to claim 1, wherein the source lines of the same type correspond to the same color.

3. The active matrix substrate according to claim 1, wherein the source lines that are adjacent to each other in the display area correspond to colors that are different from each other.

4. The active matrix substrate according to claim 1, wherein the source lines include the source lines that are odd-numbered and the source lines that are even-numbered, and
the odd-numbered source lines and the even-numbered source lines are alternately disposed in both the display area and the second section.

5. The active matrix substrate according to claim 1, wherein some of the source lines that run through the inner non-display area intersect each other in the first sections to thereby change the arrangement of the source lines that run through the inner non-display area.

6. The active matrix substrate according to claim 1, wherein the source lines include at least one pair, each pair having a first set including the source lines of the first type to the $P^{th}$ type and a second set including the source lines of the first type to the $P^{th}$ type,
the pairs are sequentially arranged from one side to another in an extending direction of the gate lines, and
the source lines of the same type that are included in each pair
sandwich, in the display area, the source lines of different types that are included in the pair and are adjacent to each other in the second section.

7. An active matrix substrate according to claim 1, wherein P=6 is given,
the source lines of the first type and the fourth type correspond to a first color,
the source lines of the second type and the fifth type correspond to a second color,
the source lines of the third type and the sixth type correspond to a third color, and
the first color to the third color are colors that are different from each other.

8. The active matrix substrate according to claim 1, wherein the first sections sandwich the second section in the extending direction of the source lines.

9. An active matrix substrate comprising:
a substrate in which an opening area, an inner non-display area outside of the opening area, and a display area outside of the inner non-display area are set;
a plurality of gate lines and a plurality of source lines that intersects the gate lines, the gate lines and the source lines extending on the substrate so as to bypass the opening area; and
a plurality of pixel transistors that is provided in the display area on the substrate so as to correspond to intersections of the gate lines and the source lines in only the display area,
wherein the source lines include
the source lines corresponding to a first color, the source lines corresponding to a second color, and the source lines corresponding to a third color, and
are arranged so that the corresponding colors repeat in the display area in an order of the first color, the second color, and the third color;
wherein the inner non-display area includes first sections and a second section; and
wherein the source lines that run through the inner non-display area
are changed in arrangement in the first sections and
are arranged in the second section so that the corresponding colors repeat in an order of the first color, the first color, the second color, the second color, the third color, and the third color.

10. The active matrix substrate according to claim 9, wherein the source lines include a plurality of sets, each including the source lines of a first type to a $P^{th}$ type, where P is a natural number greater than or equal to 3; and
wherein, with a natural number K,
the source lines of the $(3K-2)^{th}$ type correspond to the first color,
the source lines of the $(3K-1)^{th}$ type correspond to the second color,
the source lines of the $(3K)^{th}$ type correspond to the third color, and
the source lines that run through the inner non-display area are arranged so that, in the second section, each source line is adjacent to another source line of the same type at least one side.

* * * * *